(12) United States Patent
Robert et al.

(10) Patent No.: US 8,783,113 B2
(45) Date of Patent: Jul. 22, 2014

(54) MEMS DYNAMIC PRESSURE SENSOR, IN PARTICULAR FOR APPLICATIONS TO MICROPHONE PRODUCTION

(75) Inventors: Philippe Robert, Grenoble (FR); Arnaud Walther, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 268 days.

(21) Appl. No.: 13/186,697

(22) Filed: Jul. 20, 2011

(65) Prior Publication Data

US 2012/0017693 A1 Jan. 26, 2012

(30) Foreign Application Priority Data

Jul. 22, 2010 (FR) ...................................... 10 56002

(51) Int. Cl.
| | | |
|---|---|---|
| *G01L 7/00* | (2006.01) | |
| *G01L 9/00* | (2006.01) | |
| *G01L 1/00* | (2006.01) | |

(52) U.S. Cl.
USPC .................................. 73/753; 73/700; 73/777

(58) Field of Classification Search
CPC ...................... B81B 3/0021; B81B 2201/0257; B81B 2201/0264; B81B 2203/0127; B81B 2203/051; H04R 9/08; H04R 11/04; H04R 9/005; H04R 9/04
USPC ........................................... 73/753, 777, 700
See application file for complete search history.

(56) References Cited

U.S. PATENT DOCUMENTS

| | | | |
|---|---|---|---|
| 5,251,264 | A | 10/1993 | Tichy |
| 5,537,083 | A | 7/1996 | Lin et al. |
| 2002/0009202 | A1 | 1/2002 | Sheplak et al. |
| 2005/0013457 | A1 | 1/2005 | Sheplak et al. |
| 2005/0052723 | A1 | 3/2005 | Watanabe |
| 2005/0053525 | A1 | 3/2005 | Segal et al. |
| 2005/0065741 | A1 | 3/2005 | Segal et al. |
| 2006/0125033 | A1 | 6/2006 | Segal et al. |

(Continued)

FOREIGN PATENT DOCUMENTS

| | | |
|---|---|---|
| DE | 10 2005 008 511 A1 | 8/2006 |
| EP | 1 978 779 A2 | 10/2008 |

(Continued)

OTHER PUBLICATIONS

U.S. Appl. No. 13/184,858, filed Jul. 18, 2011, Robert.

(Continued)

*Primary Examiner* — Lisa Caputo
*Assistant Examiner* — Brandi N Hopkins
(74) *Attorney, Agent, or Firm* — Oblon, Spivak, McClelland, Maier & Neustadt, L.L.P.

(57) ABSTRACT

A pressure sensor of the MEMS and/or NEMS type is disclosed, including:
- at least one first deformable cavity (20) to receive pressure variations from an ambient atmosphere, this first deformable cavity being made in a first substrate and including at least one mobile or deformable wall (25), arranged at least partially in the plane parallel to the first substrate, called plane of the sensor, pressure variations from an ambient atmosphere being transmitted to said cavity,
- a detector (24, 24') for detecting a displacement or deformation, in the plane of the sensor, of said mobile or deformable wall, under the effect of a pressure variation of the ambient atmosphere.

26 Claims, 12 Drawing Sheets

(56) References Cited

U.S. PATENT DOCUMENTS

| | | | |
|---|---|---|---|
| 2006/0237805 | A1 | 10/2006 | Segal et al. |
| 2007/0222011 | A1* | 9/2007 | Robert et al. ............... 257/415 |
| 2008/0123242 | A1 | 5/2008 | Zhou |
| 2008/0164541 | A1 | 7/2008 | Segal et al. |
| 2008/0208425 | A1* | 8/2008 | Riccoti et al. ................ 701/70 |
| 2008/0247586 | A1 | 10/2008 | Takano et al. |
| 2008/0267431 | A1 | 10/2008 | Leidl et al. |
| 2010/0002543 | A1 | 1/2010 | Schlosser et al. |
| 2010/0022045 | A1 | 1/2010 | Segal et al. |
| 2010/0058865 | A1* | 3/2010 | Zhang et al. ............. 73/514.38 |

FOREIGN PATENT DOCUMENTS

| | | |
|---|---|---|
| FR | 2 951 826 | 4/2011 |
| GB | 2 218 303 A | 11/1989 |
| JP | 58-50895 | 3/1983 |
| WO | WO 93/19561 A1 | 9/1993 |
| WO | WO 94/14240 A1 | 6/1994 |
| WO | WO 01/19133 A1 | 3/2001 |
| WO | WO 2005/031299 A2 | 4/2005 |
| WO | WO 2010/038229 A2 | 4/2010 |

OTHER PUBLICATIONS

French Preliminary Search Report issued Feb. 18, 2011 in patent application No. FR 1056002.

Matthias Winter, et al., "Influence of a chip scale package on the frequency response of a MEMS microphone", Microsystem Technologies; Micro and Nanosystems Information Storage, and Processing Systems, Springer, Berlin, DE, vol. 16, No. 5, XP019804454, Dec. 25, 2009, 7 pages.

Kurt Petersen, et al., "Resonant Beam Pressure Sensor Fabricated with Silicon Fusion Bonding", vol. Conf. 6, Jun. 24, 1991, pp. 664-667, XP010037438.

Sazzadur Chowdhury, et al., "Nonlinear Effects in MEMS Capacitive Microphone Design", Proceedings of the International Conference on MEMS, NANO and Smart Systems (ICMENS'03), 2003, 6 pages.

Alfons Dehe, "Silicon Microphone Development and Application", Sensor and Actuators A 133, 2007, pp. 283-287.

M. Brauer, et al., "Improved Signal-to-noise Ratio of Silicon Microphones by a High-impedance Resistor", J. Micromech. Microeng. 14 (2004), pp. 86-89.

Dr. Kaigham (Ken) J. Gabriel, Chairman & CTO, "Akustica" http://www.ece.cmu.edu/~jzhu/class/18200/F05/Lecture05.Gabriel.pdf, Sep. 29, 2005, 46 pages.

John J. Neumann Jr., et al., "CMOS-MEMS membrane for audio-frequency acoustic actuation", Sensors and Actuators A 95 (2002), pp. 175-182.

Joerg Rehder, et al., "Balanced Membrane Micromachined Loudspeaker for Hearing Instrument Application", Institute of Physics Publishing, J. Micromech. Microeng. 11 (2001), pp. 334-338.

Brett M. Diamond, et al., "Digital Sound Reconstruction Using Arrays of CMOS-MEMS Microspeakers", Transducers '03—The 12$^{th}$ International Conference on Solid State Sensors, Actuators, and Microsystems; Boston, Jun. 8-12, 2003, pp. 292-295.

Ryan Hickey, et al., "Time and Frequency Response of Two-arm Micromachined Thermal Actuators", J. Micromech. Microeng., 13 (2003), pp. 40-46.

Fatima Lina Ayatollahi, et al., "Design and Modeling of Micromachined Condenser MEMS Loudspeaker using Permanent Magnet Neodymium—Iron—Boron (ND—Fe—B)", ICSE2006 Proc. 2006, pp. 160-166.

Matthew I. Haller, et al., "A Surface Micromachined Electrostatic Ultrasonic Air Transducer", 1994 Ultrasonics Symposium, pp. 1241-1244.

P. Rangsten, et al., "Electrostatically Excited Diaphragm Driven as a Loudspeaker", The 8$^{th}$ International Conference on Solid-State Sensors and Actuators, and Eurosensors IX, Transducers '95, Jun. 25-29, 1995, pp. 430-433.

Yongli Huang, et al., "Capacitive Micromachined Ultrasonic Transducers (CMUTs) with Isolation Posts", Ultrasonics 48 (2008), pp. 74-81.

Seung S. Lee, et al., "Piezoelectric Cantilever Acoustic Transducer", J. Micromech Microeng. 8, 1998 , pp. 230-238.

* cited by examiner

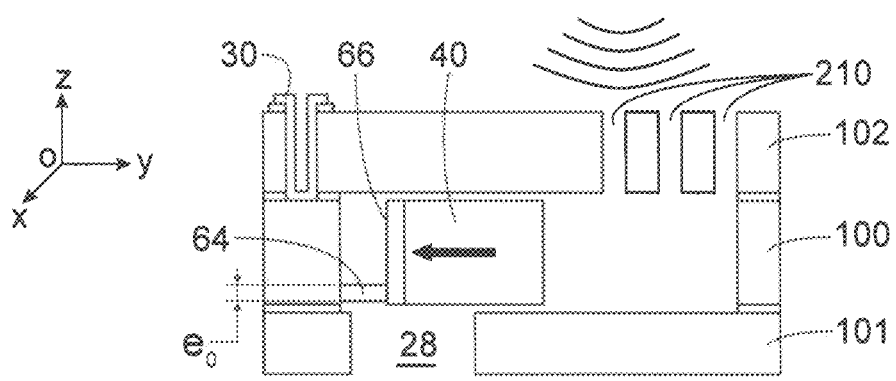
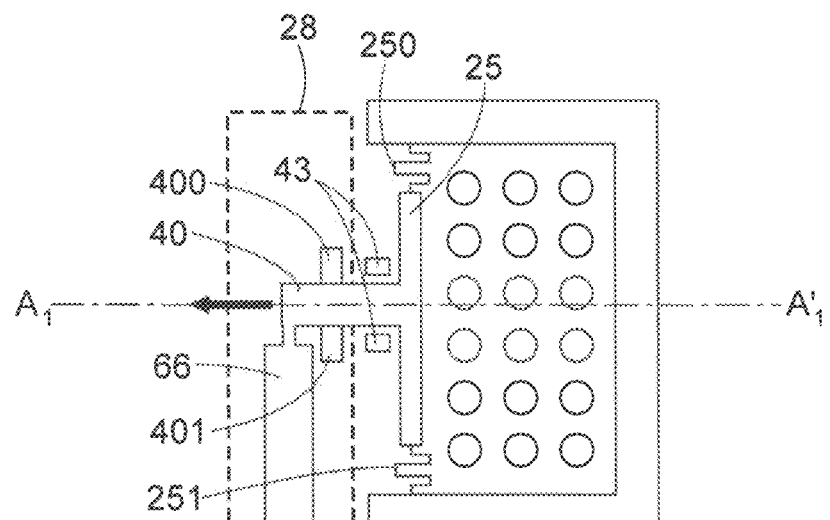
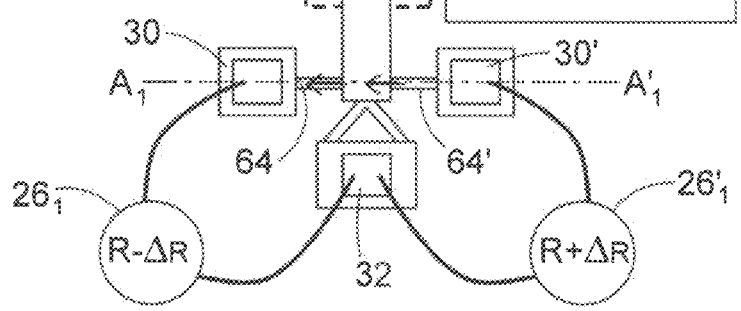

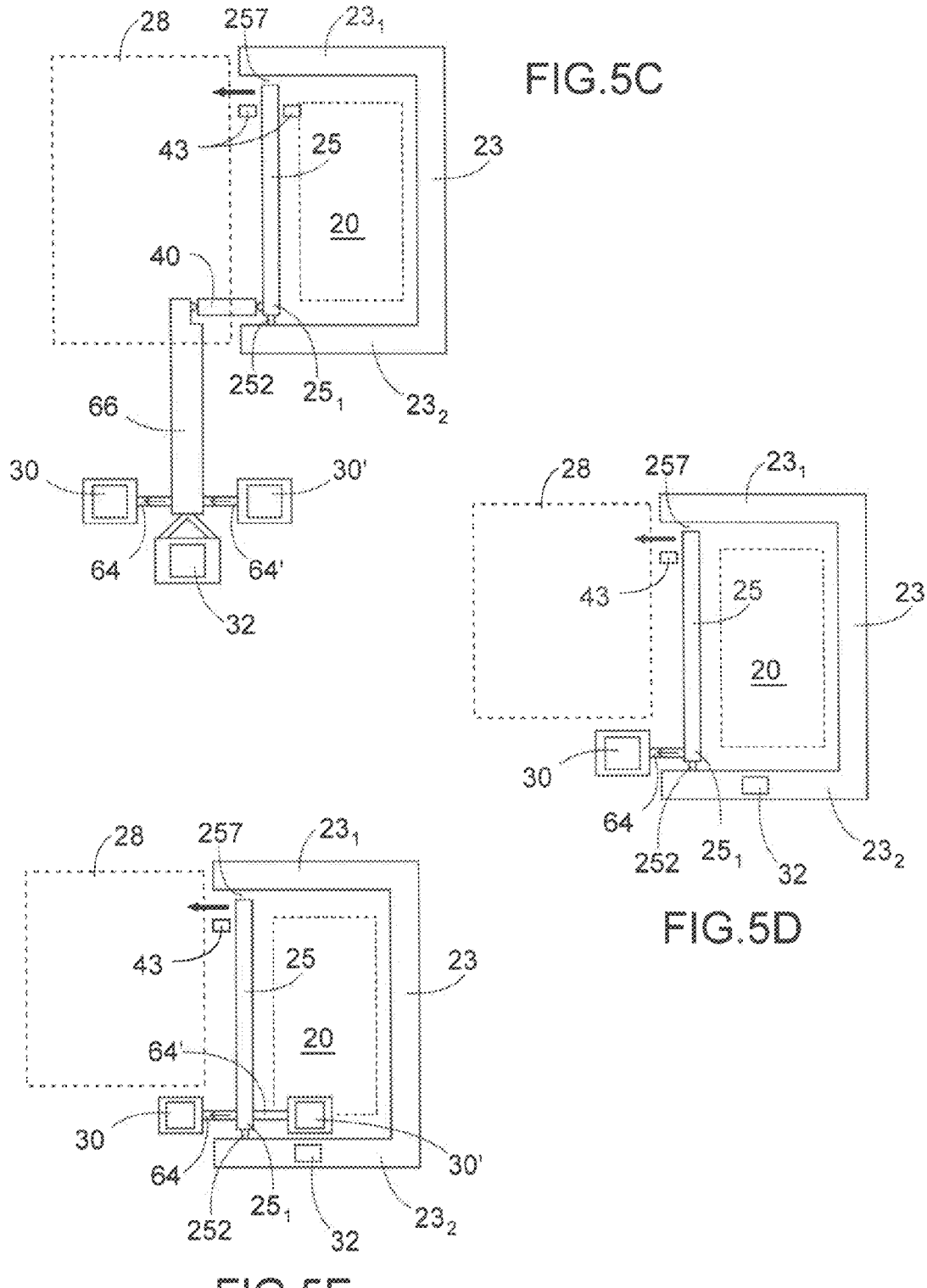

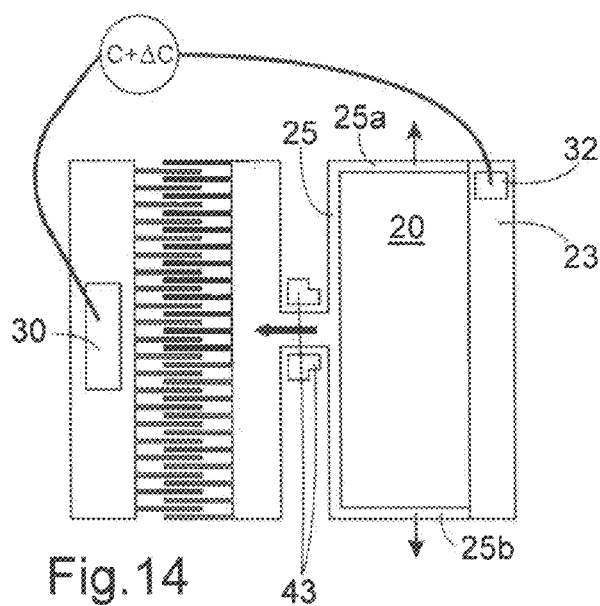
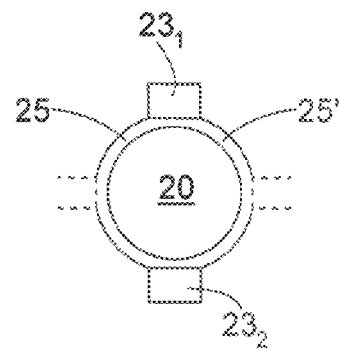
Fig.14
Fig.15B
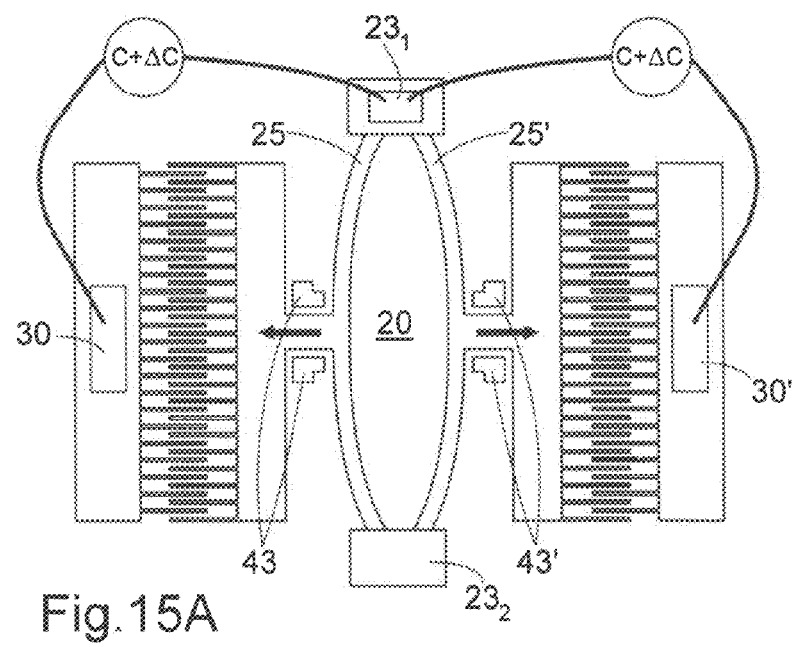
Fig.15A
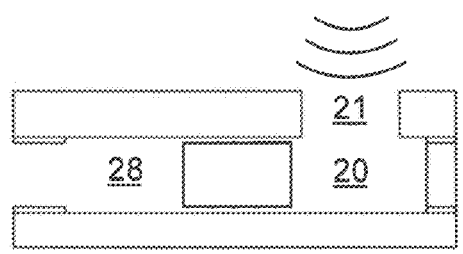 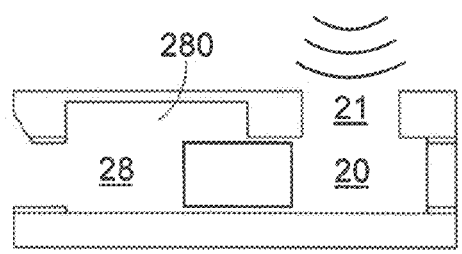
Fig.16A  Fig.16B

MEMS DYNAMIC PRESSURE SENSOR, IN PARTICULAR FOR APPLICATIONS TO MICROPHONE PRODUCTION

TECHNICAL FIELD AND BACKGROUND

The present application relates to the field of MEMS micro-sensors or MEMS dynamic sensors, in particular to produce microphones or pressure sensors, in particular of the relative type.

MEMS microphones are increasingly present in general public applications (such as mobile telephones, camcorders, cameras, ... ).

These components generally use a membrane able to deform as a function of the pressure exerted by the sound to be detected, and a means for detecting that vibration via capacitive means associated with said membrane.

The principle of this sensor is explained in the article by S. Chowdhury et al. "Nonlinear Effects in MEMS Capacitive Microphone Design." Proceedings of the International Conference on MEMS, NANO and Smart Systems (ICMENS 2003.

FIG. 1A shows the structure of a microphone 1, as explained by Matthias Winter et al. in "Influence of a chip scale package on the frequency response of a MEMS microphone"—Microsystem Technologies, December 2009, DOI 10.1007/s00542-009-0994-z. This publication also provides the equivalent electrical diagram illustrated in FIG. 1B.

A MEMS chip 12 and an ASIC 14 are fastened by connecting rods 18 to a ceramic substrate 2, which has through holes 4, making it possible for a pressure wave to reach the sensor strictly speaking, made up of a perforated counter electrode 6 and a circular membrane 8. The latter part has small openings forming vents to make it possible to offset the static pressure. Behind the membrane is a space 10 closed by a polymer layer and protected by a copper metallization.

The diagram of FIG. 1B show the (acoustic) resistance Rp brought by the presence of the holes $6_1$ into the stationary electrode 6 that the pressure wave must pass through before being able to exert a force on the membrane 8. A second acoustic resistance ($R_{gap}$) comes from the damping of the membrane 8 due to the displacement of the air gap 19 between it and the stationary electrode 6. These two resistances therefore need to be minimized to increase the sensor's sensitivity.

The reduction of the resistance Rp is done in particular by increasing the number of holes $6_1$ in the stationary electrode 6. These perforations can reach close to 20% of the total surface of the electrode as explained in the article by A. Dehe "Silicon microphone development and application."—Sensor and Actuators A 1333:283-287.

These perforations decrease the useful surface of the measuring capacitance proportionately, and therefore the sensitivity. A compromise must therefore be found.

In the aforementioned article, the author provides characteristic dimensions of these microphones.

It is also specified that the bandwidth of the sensor is also highly dependent on the sizing of the perforations $6_1$ and the air gap 19.

The air gap 19 and the perforations $6_1$ also play a decisive role in the noise of these microphones as indicated by M. Brauer et al. "Improved signal-to-noise ratio of Silicon microphones by a high-impedance resistor," J. Micromech. Microeng. 14 (2004) 86-89.

In all of the known examples, the following problems are seen.

The membrane 8, which serves both as mechanical spring and mobile electrode, recovers the acoustic signal, and is still correlated to the detection electrode 6. It is consequently not possible to optimize the acoustic part of the sensor separately from the electrical measuring part. This is characterized in particular by:
  a significant loss of sensitivity due to the presence of a large number of holes in the membrane 6, necessary from an acoustic perspective to reduce the acoustic resistance, but which greatly reduces the opposite surfaces for the capacitive detection; a reduction of the opposite surfaces of up to nearly 20% is also noted,
  a viscous damping, determined, among other things, by the air gap 19 between the membrane 8 and the stationary detection electrode 6. The gap itself depends on the pressure range to be measured (maximum bending allowed by the membrane) and the reading voltage ("pull-in" limit).

All of the known microphone structures are based on the use of a flexible membrane 8 embedded on its periphery. This means that, under the effect of outside pressure, the membrane deforms primarily in the center, but practically not at all on its periphery. As a result, only a fraction of the deformation can be used for capacitive detection.

Furthermore, it is necessary to apply a voltage between the membrane 8 and the reading electrode 6 to read the capacity variation resulting from the deformation of the membrane under the effect of the acoustic pressure to be measured. To limit the measuring noise and increase the sensitivity of said microphone, this voltage must be maximized. However, this maximization is difficult to ensure because it assumes taking several parameters into account, and in particular the size of the air gap and the maximum pressure to be measured (operation near the "pull in" voltage, i.e. the voltage for which the membrane adheres on the control electrode, is sought).

Other problems should be signaled:
  the known components are very sensitive to variations in the production method. The sensitivity of the microphone is in fact quite varied as a function of the thickness of the membrane and stresses in the material,
  the response is nonlinear as a function of the acoustic pressure, the detection capacity being proportionate to the opposite of the distance between the electrode 6 and membrane 8,
  the pressure range and the resistance to pressure shocks are very limited, the structure and the production method making it difficult to place stops in the air gap.

The problem therefore arises of finding a new sensor or micro-sensor structure of the MEMS type or a dynamic sensor of the MEMS type not having the above drawbacks and limitations.

The problem also arises of finding a new method embodiment for such a structure.

BRIEF DESCRIPTION

A pressure sensor is first disclosed, for example of the MEMS and/or NEMS type, including:
  at least one first deformable cavity to receive pressure variations from an ambient atmosphere, this first deformable cavity being made in a first substrate and including at least one mobile or deformable wall, arranged at least partially in the plane parallel to the first substrate, called plane of the sensor, pressure variations from an ambient atmosphere being transmitted to said cavity, a detector to detect a displacement or deformation, in the plane of the sensor, of said mobile or deformable wall, under the effect of a pressure variation of the ambient atmosphere.

A pressure sensor or microphone structure, for example of the MEMS type, is thus disclosed, where the wall or membrane of a detection cavity moves in the plane of a substrate or of the sensor, and not out of plane as is the case in the structures known from the prior art.

The detecting part is thus decorrelated, for example through an electrical measurement, such as a capacitive or strain gauge measurement, from the detection wall or membrane, subjected to the acoustic pressure. The sensitivity of the device is therefore increased with respect to devices of the prior art.

Pressure variations or a pressure wave from an ambient atmosphere are transmitted to said cavity perpendicularly to the plane of the sensor.

A device as disclosed herein can also include at least one secondary cavity, or buffer cavity, partially in communication with the first cavity.

A filter function of the rapid fluctuations can be carried out by an impedance loss between the main cavity and a secondary cavity or "back volume." More particularly, this impedance loss can result from a "gap" of the beam or the membrane or the mobile or deformable part, but also the width of the beam or the membrane or the mobile or deformable part. The "gap" (also called "air gap") can be a small space between the mobile part and the stationary part. It is for example located between the substrate and the mobile or deformable part, or between the mobile or deformable part and the upper substrate. Aside from its impedance loss function, this space allows the mobile or deformable part to move in the plane.

At least one secondary cavity can be made in the plane of a second substrate different from the first substrate, or can be made in the plane of the first substrate. In the first case (secondary cavity in the plane of a second substrate):
  said pressure variations of the ambient atmosphere is transmitted to said first cavity through said second substrate,
  or said second substrate is arranged on a side, parallel to said sensor plane, of the first substrate, a third substrate being arranged on another side, extending in a plane parallel to said sensor plane, of the first substrate, said pressure variations of the ambient atmosphere being transmitted to said first cavity through said third substrate.

In other words, at least one secondary cavity, which can be open, or closed, can be made on the top or bottom side of the device. This cavity can be closed by a rigid membrane.

The detector can be of the capacitive or strain gauge type.

"Strain gauge" detection offers the advantage of being less sensitive to the outside environment, in particular moisture, than capacitive detection.

However, capacitive detection offers the following advantages:
  possibility of having a high displacement amplitude of the mobile or deformable wall or membrane, which can go up to several hundred nanometers, for example up to 500 nm,
  possibility of having a wide range of polarization voltages (especially in the case of a differential capacitive measurement), for example up to 30 V.

In one particular embodiment, the detector includes a capacity, with surface variation, including at least one comb able to move in the plane of the sensor and at least one second comb, stationary, the teeth of the first comb and those of the second comb alternating, a displacement or deformation in the plane of the sensor of said mobile or deformable wall being transmitted to said first comb.

In another particular embodiment, the capacitive detector is based on an air gap variation.

In the case where the detector is of the strain gauge type, it can also have at least one lever arm able to move in the plane of the sensor, a displacement or deformation of said mobile or deformable wall, in the plane of the sensor, being transmitted to said lever arm and at least one strain gauge, said strain gauge making it possible to detect a displacement of the lever arm in the plane of the sensor.

At least one mobile or deformable wall can include two lateral ends, and:
  be embedded or fastened at one of these lateral ends on a stationary wall, and be free at its other end,
  or be embedded or fastened at both of its lateral ends,
  or be rigid, and maintained at both of its lateral ends by deformable elements.

In a device as disclosed herein, the resonance frequency of the mobile part (the membrane or the wall or the piston or one of these elements and one or more suspension arm(s)) is decorrelated from the impedance loss test (gap, piston depth, vent openings).

A sensor as disclosed herein can include a first detector and a second detector means mounted so as to perform a differential measurement.

A sensor as disclosed herein can include a differential structure, making it possible only to detect the pressure variations inside the main cavity, but not impacts or accelerations outside the device.

Pressure variations from an ambient atmosphere can be transmitted, in the first cavity, through at least one opening arranged opposite an opening of said first deformable cavity and a membrane arranged on an opening of said first deformable cavity.

At least one detector is mechanically connected to said mobile or deformable wall, without being disposed on or over or directly above said wall.

A device for detecting pressure variations is also concerned, including several sensors as above, each sensor having a bandwidth different from that of each of the other sensors.

A device can include several parallel deformable first cavities, at least two of these cavities having shared detectors. This offers the possibility of increasing the sensitivity of the sensor.

It is therefore possible to associate the mobile or deformable wall with detection elements of the capacitive comb or strain gauge type. This makes it possible to configure and optimize the cavity receiving the pressure to be measured (the stiffness and/or damping of one or several mobile or deformable walls and/or the dimensions of the cavity) independently of the detectors. In particular, the membrane and the cavity receiving the pressure are configured independently of:
  the dimensions and number of interdigital combs in the case of a capacitive detection,
  the dimensions of the gauge, in the case of use of a strain gauge (resistance measurement in the piezoresistive case or resonance frequency measurement in the case of a resonator-type gauge).

A device as disclosed in this application can also include at least one electric contact, on a first face (called front face) or on a second face (called rear face) of the device.

A device as disclosed in this application forms a relative pressure sensor: a pressure variation measurement takes place, between the "instantaneous" pressure of the measured outside environment and an "average" pressure of that same outside environment (or another reference pressure); this average pressure is for example obtained by the "back volume" (or secondary cavity), in contact with the outside environment.

Also described is a device for recovering acoustic energy, including a sensor as above, and a device storing electrical energy resulting from said pressure variations or produced after these pressure variations.

A method for producing a MEMS and/or NEMS pressure sensor is also disclosed, including, in this order or another order:

the production or the making, in a first substrate, of at least one first deformable cavity for receiving pressure variations from an ambient atmosphere, this deformable cavity being delimited by at least one mobile or deformable wall, the production or the making of at least one detector detecting a displacement or a deformation, in the plane of the substrate, called plane of the sensor, of said mobile or deformable wall, under the effect of a pressure variation, pressure pulses being transmitted from an ambient atmosphere to said cavity.

Such a method can also include the production of at least one secondary cavity, or buffer cavity, partially communicating with the first cavity.

At least one secondary cavity can be made in the plane of a second substrate, different from the first substrate, or in the plane of the first substrate.

In said method, the first substrate and the second substrate can be assembled via a dielectric layer to form a SOI substrate.

Said method can also include an assembly of the first substrate with a third substrate, said pressure variations being transmitted to the first cavity through said third cavity.

The detector can be made at least partially in the first substrate.

BRIEF DESCRIPTION OF THE DRAWINGS

FIGS. 13A-15B show, in top view, other embodiments of a device, FIGS. 16A and 16B show an alternative of a secondary cavity (or "back volume") of a device.

DETAILED DESCRIPTION

Figure 1A:
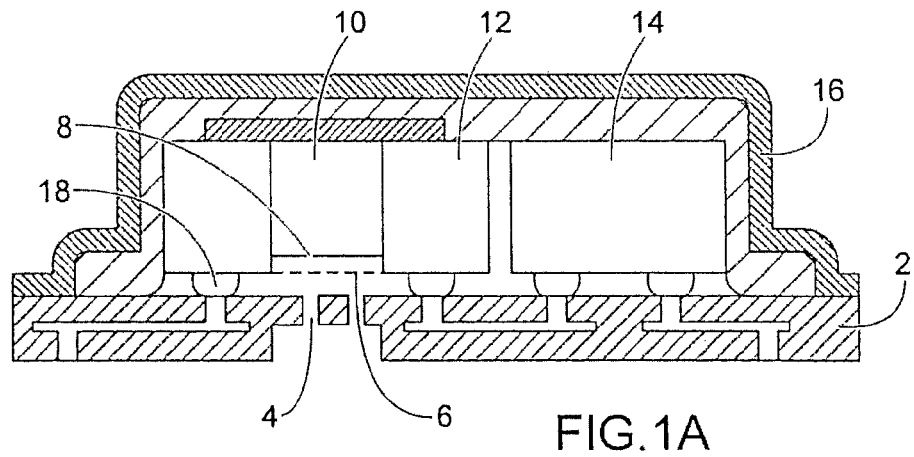
FIGS. 1A and 1B show examples of a device of the prior art.
Figure 1B:
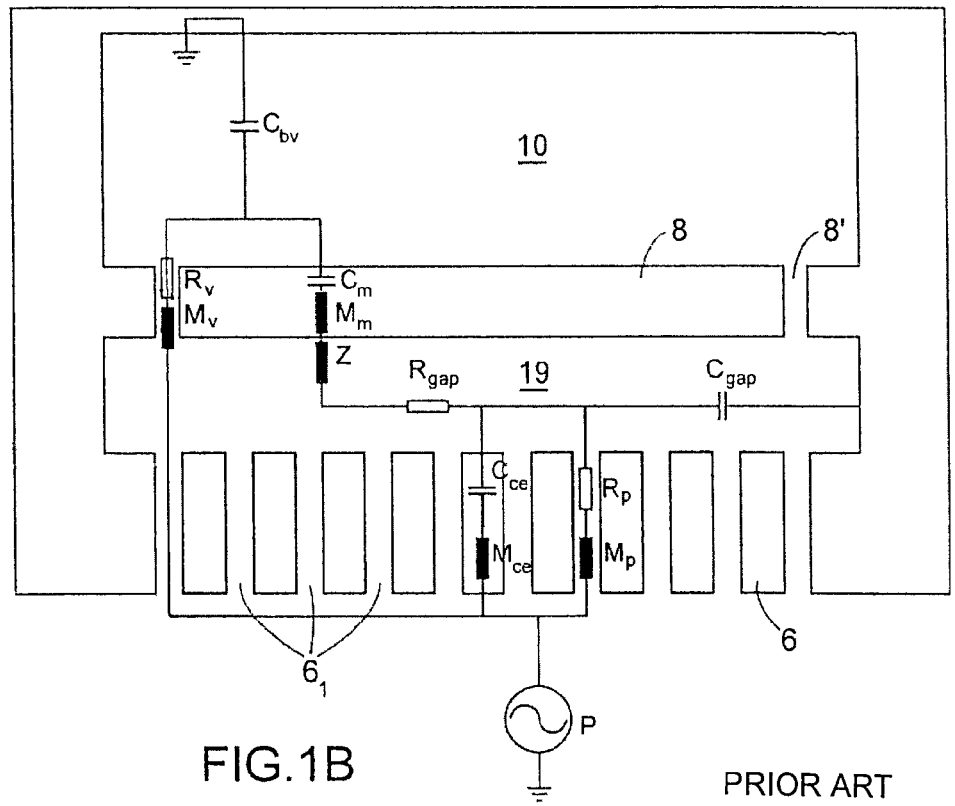
Figure 2A:
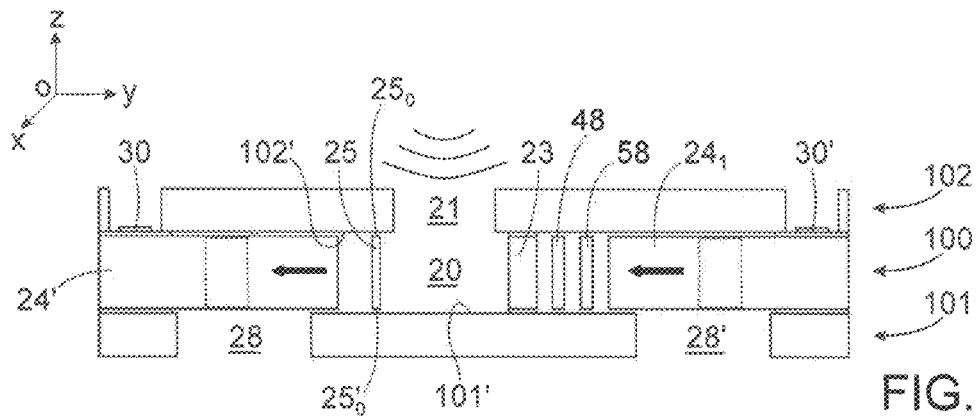
FIGS. 2A-2C show, in side view, cross-section, and top view, one embodiment of a device, and an alternative.
Figure 2B:
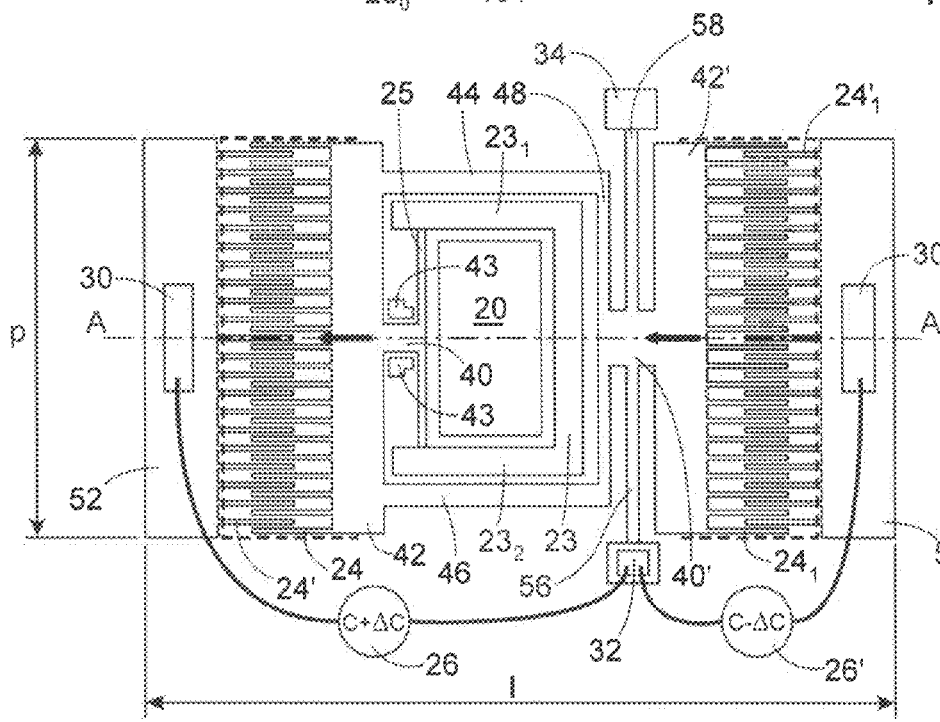

A first example of a structure is illustrated in FIG. 2A, which is a cross-sectional view along a plane, the outline AA' of which is shown in FIG. 2B (top view). Portions of an uppermost layer or substrate are omitted in FIG. 2B (and other top views herein) for clarity of a top view of the sensor plane.

Hereinafter, when we talk about "substrate" 100, 101, 102, this may also be understood as a "layer." As a result, for these three elements, both of these terms may be used interchangeably.

Such a structure can be made in 2 or 3 substrates 100, 101, 102 (the case of FIG. 2A is with 3 substrates) superimposed and assembled with each other, the substrate 100 being arranged between the substrate 101 and the substrate 102. Each of the substrates 100, 102 has a thickness for example between several μm and several tens of μm, for example between 1 μm or 5 μm and 10 μm or 50 μm. The substrate 101 has a thickness for example between several tens of μm and several hundreds of μm, for example between 100 μm or 500 μm and 1000 μm, for example substantially close to 750 μm. These dimensions can be used for all of the devices described below.

Each of these substrates extends in a plane xy, the z axis being perpendicular to each of them. The thickness of each substrate, measured along this z axis, can, in certain cases, be very small before the lateral extensions of the device, i.e. before the dimensions p and l of the device measured in the plane xy; p (measured along the x axis) is for example between 100 μm and 1 mm and l (measured along the y axis) is for example in the vicinity of several hundreds of micrometers, for example between 100 μm and 500 μm or 1 mm. The substrates can each be made from a semiconductor material (for example made from Silicon or SiGe). They are connected to each other by adhesion zones, for example via one or several layers favoring adhesion, such as a layer of silicon oxide, at the interface of two substrates, except in the zones having a mobile nature as explained below. Hereafter, the plane xy will be called the plane of the device. This structure is found in the other embodiments presented below. These aspects may be used for all of the devices described below.

Hereafter, the lower part or side of the device is the part facing the substrate 101 and the upper part or side of the device is the part facing the opposite side, towards the substrate 102.

The device first includes a cavity 20, made in the substrate 100; the upper part of this cavity is open, i.e. it has an opening in the upper part of the substrate 100. An opening 21, which communicates with that of the substrate 100, is also made in the substrate 102. Alternatively (examples of which will be shown below), this opening includes a plurality of orifices forming a grid, for example to limit the introduction of foreign items, such as dust, in the cavity 20. It can therefore also serve as a filter. Also alternatively, the cavity is closed by a flexible membrane, such as the membrane 200 shown in FIG. 7A.

Pressure variations or a pressure wave from an ambient atmosphere are transmitted to cavity 20 perpendicularly to the plane of the sensor.

In the plane of the substrate 100, the cavity 20 is delimited by side walls 23, $23_1$, $23_2$, 25, some of which (the walls 23, $23_1$, $23_2$) are stationary, and at least one other of which (here the wall or membrane 25) is mobile in plane xy of the device. In the example shown in FIGS. 2A and 2B, the cavity 20 is rectangular in the plane of the device, but another shape can be made.

Other cavity structures 20, essentially having mobile walls connected to one of the stationary parts of the device, will be detailed below, relative to FIGS. 14 and 15. In particular, the structure of FIG. 15 is an alternative of that of FIGS. 2A and 2B, in that it includes the same detecting means, of the capacitive comb type mounted to perform a differential measurement.

The atmosphere whereof the pressure needs to be measured can penetrate this cavity 20 through the opening 21. Under the effect of a pressure variation (relative to the average pressure), the mobile wall 25 will be displaced or deformed in plane xy.

In the illustrated example, the ends of the mobile wall 25 are fastened to two stationary walls $23_1$, $23_2$, and a deformation of the mobile wall will therefore occur. The wall here is therefore of the "embedded-embedded" type, i.e. both of its lateral ends are embedded in a stationary part of the device. This wall can have approximately the following geometric characteristics:

- height (measured along the z axis): substantially equal to the thickness of the substrate 100, therefore between several tens of µm and several hundreds of µm; but in certain embodiments, it can be between several µm and several tens of µm (for example between 5 µm and 50 µm),
- width (measured along the y axis): for example, between 0.5 µm and 10 µm; this width is small enough for the wall 25 to have the desired sensitivity to pressure variations occurring in the cavity 20,
- length (measured along the x axis): for example between 100 µm and 1 mm.

The mobile wall, alternatively, can be of the type shown below, relative to FIGS. 5A and 5B: it then includes a rigid main part that moves under the effect of the pressure, and at least one or two lateral parts 250, 251 forming a "spring," connected to the stationary and deformable part.

Still another example of a wall that can be implemented in such a device is the wall structure of the "embedded-free" type, which will be detailed later in relation to FIGS. 5C and 5D.

In this embodiment, as in the following embodiments, it is possible to use one or the other of the different types of deformable wall or membrane just presented or that will be presented in the continuation of this text.

Alternatively, several cavities can be made in the substrate 100, examples of which will be seen later.

Figure 13A:
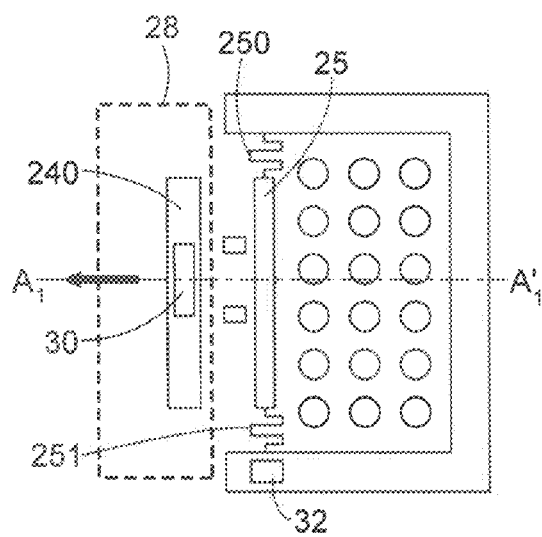

The detection means 24 is associated with the mobile wall, this means here having the form of capacitive combs. These capacitive combs are arranged according to a particular configuration, which will be explained below, with a displacement of the mobile part of the combs along the y axis and along the extension direction of the teeth of the comb. But other configurations are possible, such as that of FIG. 13B, with an extension direction of the teeth of the comb along the x axis (and a movement of the part of the comb along the y axis). A capacitive detection can also implement a fixed electrode 240 opposite the deformable membrane 25, as shown in FIG. 13A. Alternatively, this detection means can include one or more strain gauge(s), for example one or more suspended piezoresistive gauges. Here again, examples will be provided below.

Regardless of the nature of the detection means, a differential measurement or detection can be done, as explained later. This is in particular the case when the walls that delimit the cavity 20 include two walls able to move in opposite directions. The means 24 implements a variation of a physical parameter, the variations of which will make it possible to detect a variation in the volume of the cavity 20. It can therefore be associated with a means 26 that makes it possible to cause a variation of this physical parameter of the detection means 24, here a capacitance variation when the relative position of the combs varies. When one of the mobile walls is displaced or deformed, the detection means 24, 26 detects the corresponding displacement or deformation or the corresponding variation of the volume 20.

In this example, as in the examples below, the cavity 20 and the means 24 are made in the intermediate substrate 100.

The cavity 20 receives the pressure variations to be measured. The other side of the membrane or the wall 25 is in contact with the "average" ambient pressure, for example the atmospheric pressure. To that end, the device can include at least one secondary or lower cavity 28, 28', made in the lower substrate 101. This cavity is open under the device. Also alternatively, explained more precisely later, it is possible to make a closed secondary cavity above or below the device, but then preferably voluminous enough (its volume can then be at least several times the volume of the cavity 20, for example at least 5 times the volume thereof, for example 10 times the volume of that cavity 20) to allow the mobile structure to move under the effect of an outside pressure variation without excessive damping.

Figure 2C:
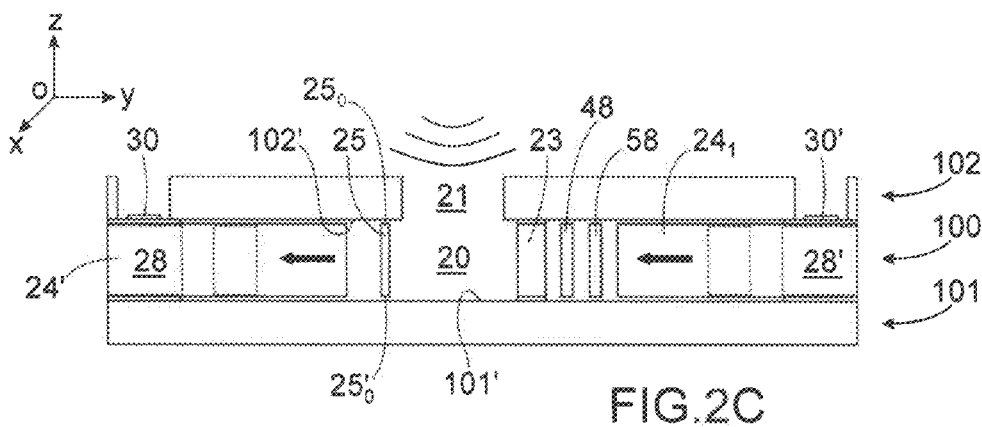

According to still another alternative, one or several secondary cavities 28, 28' can be open (or may be closed) on the side, for example at least one cavity of this type is made in the intermediate substrate 100. Examples of lateral cavities are illustrated in FIG. 2C, 16A-16B.

Irrespective of its shape and position in the device, this secondary cavity is also designated by the expression "back volume." It is situated, in FIGS. 2A and 2B, and in most of the other illustrated embodiments, in a plane or substrate 101 or 102 (case of FIG. 7A) different from that of the cavity 20 and means 24. However, in the case of FIGS. 2C, 16A-16B, it is made in the same substrate as that of the main cavity at 20.

In the present example, this secondary cavity is offset, in its own plane relative to the cavity 20. In other words, there is no intersection between the projection, in the plane of the substrate 101, of the main cavity 20, and the contour of the secondary cavity 28.

But there is also a communication between these two cavities, or, more generally, between the main cavities and each of the secondary cavities, because a space, which can be fairly small, is maintained between the upper part $25_0$ and/or the lower part $25'_0$ of the wall 25, and the upper surface 101' of the substrate 101 and the lower surface 102' of the substrate 102. A leak is thus ensured between the two cavities 20 and 28. In this way, and irrespective of the pressure and the position of the mobile wall, the cavity 20, which is in communication with the outside atmosphere via the opening 21, is also in communication with any one of the secondary cavities 28, 28'. One or more of these secondary cavities make it possible to reduce the compression effects of the gas during a displacement of the membrane, which is advantageous, since such a compression tends to decrease the sensitivity of the device. This or these cavities can also be called damping cavities or reference cavities (because they contain the average reference pressure, the measurement of the outside pressure variation being done in reference to this average reference pressure).

The deformable cavity 20, and the secondary or damping cavity or cavities 28, 28' are therefore partially in communication and partially separated at least by the wall or membrane 25, which itself is able to move (or deform) in the plane of the substrate under the effect of a pressure variation between the cavity 20 and the cavities 28, 28'.

The device also includes contact zones 30, 30', 32. These contact zones make it possible to apply a voltage difference between the mobile and stationary parts of the device, but they can also make it possible to connect means 26, 26' for measuring a variation of the physical parameter, here a capacitance variation, when one of the combs moves. In the illustrated example, these contacts are arranged on the front face of the device, i.e. it is possible to access them through, or they can be made in, openings formed in the substrate 102. However, alternatively, it is also possible to make contacts on the rear face, as will be seen in the examples below.

We will now provide a slightly more detailed description of the structure of the capacitive combs 24 used as detection means for the embodiment presented above. As will be seen later, other capacitive detection means can be provided.

A first comb is connected to the mobile wall 25 via an arm 40 that extends substantially along the y axis. When the wall 25 is moved in the direction indicated in FIG. 2B (and in fact also along direction y), due to a pressure increase (or decrease, respectively) in the cavity 20, this wall pushes (pulls, respectively) the arm 40, which in turn pushes (pulls, respectively) the comb 24. The amplitude of the movement of the wall 25 can be limited by one or more stationary mechanical stops 43 arranged on the path of the wall, for example on either side of the arm 40.

The comb 24 has teeth that are parallel to each other, each tooth extending in plane zy. These teeth are made in the substrate 100. They are all fastened to an arm 42, arranged substantially perpendicular to plane zy, therefore rather along the x axis and perpendicular to the arm 40.

A stationary part 52 of the device, also made in the form of an arm substantially parallel to the arm 42, is also fastened or connected to a comb 24', which itself also has a row of teeth that are parallel to each other, each of them also being arranged in a plane in direction zy. These teeth of the stationary part are also made in the substrate 100.

The teeth of the two rows of teeth of the combs 24, 24' are alternating, in that part of each tooth (except potentially the teeth located at the end of a row of teeth) of the comb 24 is arranged between two adjacent teeth of the comb 24'. And part of each tooth (except potentially the teeth located at the end of a row of teeth) of each comb is arranged between two adjacent teeth of the other.

Each tooth can have a thickness, measured along the x axis, between 5 and 100 µm. Two adjacent teeth of a same comb are separated by a distance that can be between 0.5 µm and 10 µm.

The teeth of the two combs are electrically conductive.

When the device is idle and when a suitable voltage difference is established between the two rows of teeth, a set of parallel capacitances is made. Moving the wall 25 causes, via the arm 40, the teeth of the mobile comb 24 to move relative to the teeth of the stationary comb 24', which causes a variation of the set of capacitances. This variation is detected by the means 26 and translates the displacement of the wall 25.

The embodiment of FIG. 2B shows that the arm 42 in fact makes up one of the sides of a mobile but undeformable frame including three other arms or sides 44, 46, 48 that surround the walls 23, 23$_1$, 23$_2$, 25 delimiting the cavity 20. It is therefore this entire frame that is made to move when the wall 25 is displaced or deformed due to a variation of the pressure in the cavity 20. The side or the arm 48, opposite the arm 42, can also be connected, by an arm 40', oriented along the x axis, to a mobile comb 24$_1$, which is therefore also displaced, in the same direction as the arm 40', when the wall 25 moves. The comb 24$_1$ is also made in the substrate 100. Its teeth are all fastened to an arm 42', arranged substantially perpendicular to the plane zy, therefore rather along the x axis and perpendicular to the arm 40'. The mobile frame in particular performs a function of transmitting the movement to the second mobile comb 24$_1$.

Lastly, associated with this comb 24$_1$ is a stationary comb 24'$_1$, the teeth of which are fastened to a stationary part 52' of the device and with which it cooperates in the same way the mobile comb 24 cooperates with the stationary comb 24'. The alternating relative arrangement of the teeth of these two combs 24$_1$, 24'$_1$ is similar or identical to what was already described above for the two combs 24, 24'. The stationary part 52' is also made in the form of an arm substantially parallel to the arm 42'. Fastened or connected to this stationary part 52' are the teeth of the comb 24', arranged in a row of teeth parallel to each other, each also being arranged in a plane in direction zy. The arm 52' and the teeth of the stationary comb 24'$_1$ are also made in the substrate 100.

Each tooth of each comb 24$_1$, 24'$_1$ can have a width, measured along the x axis, between 1 µm and 10 µm. Two adjacent teeth of a same comb are separated by a distance that can be between 0.5 µm and 10 µm.

The teeth of the two combs 24$_1$, 24'$_1$ are electrically conductive.

When the device is idle and when a suitable difference in the voltage is established between the two rows of teeth of the two combs 24$_1$, 24'$_1$, a set of parallel capacitances is made. A movement of the wall 25 causes, via the arms 40, 42, 44, 46, 48, 40', a displacement of the teeth of the mobile comb 24$_1$ relative to the teeth of the stationary comb 24'$_1$, which causes a variation in the set of capacitances. This variation is detected by the means 26' and translates the displacement of the wall 25.

This device can also include a guide means 56, 58, in plane xy in which the membrane of the mobile or deformable wall as well as the detection means move.

This means here assumes the form of at least one arm 56, 58, for example two arms, each arranged substantially in direction x, in plane xz, but with a width (which can be between 1 µm and 10 µm), in direction y, small enough to allow each of the arms to have, in that same direction x, sufficient flexibility during a movement that results from a displacement of the wall 25.

The arm 56 can be arranged, as illustrated in FIG. 2A, between the side 48 of the mobile frame formed around the cavity 20, and the arm 42' of the second mobile comb 24$_1$. Being mechanically connected to the stationary part of the device, it makes it possible to guide the displacement of the mobile part in the plane of the substrate 100 and to return said mobile part to its starting position after an internal pressure in the cavity 20 returns to its initial value, before variation. A second arm 58, which can be symmetrical to the arm 56 relative to an axis parallel to the y axis, and also connected to a stationary part 34 of the device, also makes it possible to perform this function of guiding the mobile part. The arm 58 can have the same geometric and elasticity characteristics as the arm 56.

Furthermore, a means makes it possible to apply the suitable voltage to the mobile part of the device to allow each of the electrostatic combs to play its role.

This means for applying a voltage can use, or be combined with, at least one of the arms 56, 58. For example, the arm 56 is itself mechanically and electrically connected to one of the contact studs 32 to which the desired voltage can be applied. Studs 30, 30' are also provided in other stationary parts of the device, for example in parts 52, 52'.

When the device has, as described above, two systems of combs on each side of the device, the displacement or deformation of the wall 25 causes a variation in a first direction of the capacitances of one of the two systems of combs, and a variation in a second direction, with a sign opposite the first, of the capacitors of the other of these two systems. There is therefore a differential capacitive detection.

The comb means, the arms 42, 44, 46, 48 forming the frame around the walls of the cavity 20, the arms 40, 40', are formed in the same substrate 100.

Other examples of a device as disclosed herein will be presented below.

Figure 3A:
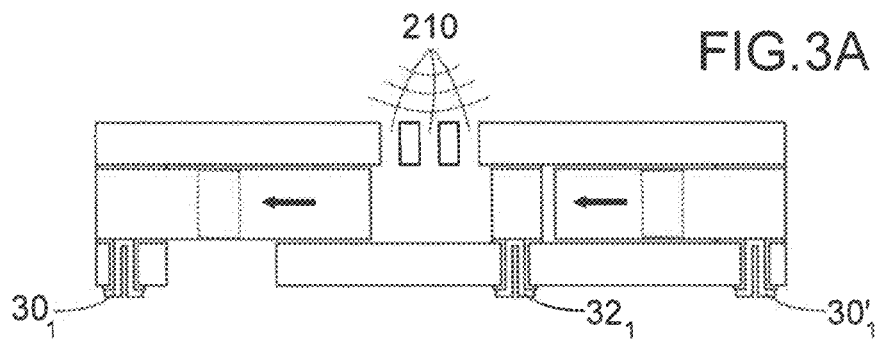
FIGS. 3A and 3B show, in side view, cross-section, and top view, one embodiment of an alternative of a device, FIGS. 4-6, 8, 9 each show, in top view, an embodiment of an alternative of a device.
Figure 3B:
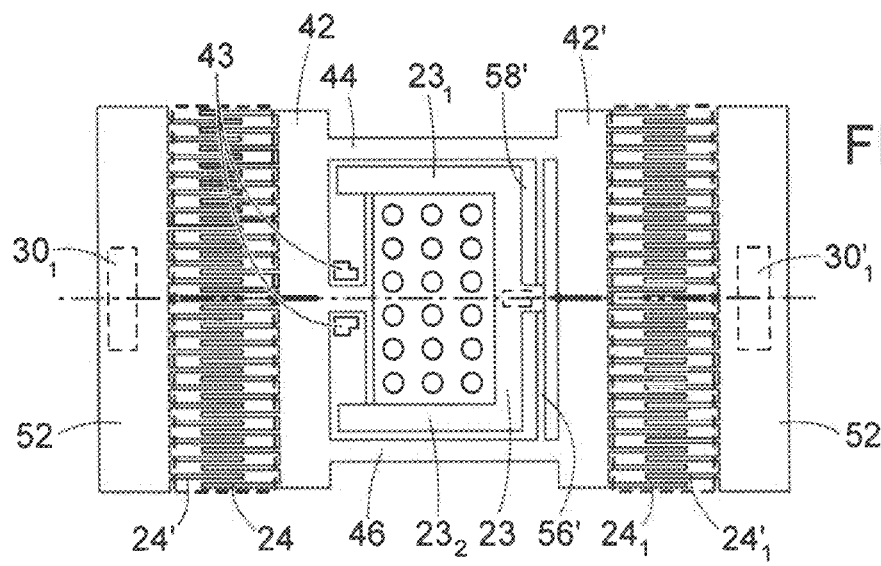

According to a second example, shown in FIGS. 3A and 3B, a sensor can also use a differential capacitive detection, with a means identical or similar to those described above relative to the first example. But the single opening 21 of the first example is in fact replaced by a set of perforations 210 formed in the substrate 102. An upper opening is thus formed having a filter function, for example making it possible to filter and limit the entry of dust into the cavity 20.

In this second example, the connections or electrical contacts $30_1$, $30'_1$, $32_1$ are made on the rear face of the component, which is the face on which the cavities 28, 28' emerge. These contacts have the same functions as the contacts 30, 30', 32 of the first example described above. But they are made on the surface of the lower substrate 101, or in this lower substrate 101.

It can be seen that, in this example, the mobile frame is made more simply since the two arms 42, 42' each form one side of this mobile frame. Connected to these arms, in direction y, are two parallel transverse arms 44, 46. Guide arms 56', 58' this time are situated inside the mobile frame, they are connected on one hand to the mobile part, more particularly to the arms 44, 46, and on the other hand to a stationary wall 23 of the cavity 20.

It is possible to modify the first example to replace the front contacts there with rear contacts and the mobile frame structure described above with that of the second example.

Figure 4:
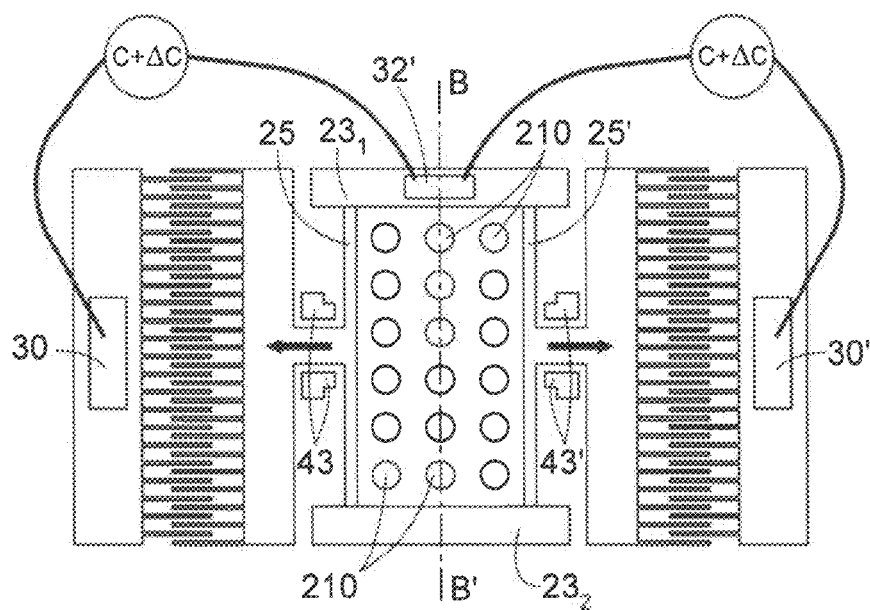

A third example is shown in top view in FIG. 4. It includes two mobile walls 25, 25', each being connected to its own system of capacitive detection combs. These two walls are substantially parallel to each other when the system is idle.

In this example, the ends of each of the mobile walls 25, 25' are fastened to two parallel stationary walls $23_1$, $23_2$ and it is therefore a simultaneous deformation of the mobile walls that will occur. Each of these has a small enough width, measured along the y axis, and a length, measured along the x axis, that is sufficient to have the desired sensitivity to the pressure variations occurring in the cavity 20.

In this embodiment, each detection assembly is associated with a membrane or a different deformable wall.

In this system, a pressure variation in the cavity 20 causes a simultaneous displacement or deformation of the two walls 25, 25', but in opposite directions. This results in a capacitance variation in the same direction of the two systems of capacitive detection combs, which are symmetrical to each other relative to a median plane, outlined BB' in FIG. 4, of the device parallel to plane xz, which makes it possible to do away with parasitic signals that may come from an outside acceleration imposed on the device. There is therefore a differential system, which does not allow a differential measurement, but which makes it possible to eliminate an acceleration component or forces that do not result from a pressure variation in the cavity 20. An example of a differential system will be seen later, in the direction indicated above, which also makes it possible to perform a differential measurement.

Having two mobile or deformable walls 25, 25', on either side of the cavity 20 relative to axis BB', this example makes it possible not to use a mobile frame, such as the frame formed by the arm 42 and the arms or walls 44, 46, 48 of FIG. 2B, to transmit the movement or displacement of the wall 25 to the second set of combs $24_1$, $24'_1$.

This embodiment can, like the preceding one, include guide arms 56, 58.

In a fourth example, illustrated in FIGS. 5A and 5B (with alternatives in FIGS. 5C and 5D), a piezoresistive detection is used. FIG. 5A is a cross-sectional view along a plane, the outline $A_1A'_1$ of which is shown in FIG. 5B (top view). The structure of the wall 25 is of the type having a rigid central portion framed by two parts 250, 251 forming a "spring," and which are deformable. Under the action of the pressure, the rigid part moves, the parts 250, 251 being deformed. These parts also return the rigid part to its initial position when the pressure returns to its initial value, after a variation. This is a so-called "piston" effect or movement of the mobile part. However, it is also possible to use, in this embodiment, the deformable membrane or wall shape, which was presented above in relation to the preceding figures.

The detection means includes at least one suspended gauge. FIG. 5B shows two suspended gauges 64, 64', mounted in differential measurement, but a system with a single gauge can also be made and operate. The end of each gauge is mounted at one end of a rigid lever arm 66 to transmit to the gauges 64, 64', from the arm 40, a generated strain resulting from the displacement of the arm 66 and amplify it. The mobile arm 40 is, here again, connected to a mobile or deformable wall 25 of the cavity. It is also oriented along the y axis. Lugs 400, 401 can be arranged on either side of the arm 40, in order to perform the stop function, in combination with the fixed studs 43, in particular in the case of a depression or partial vacuum in the cavity 20.

The lever arm 66 is, in the idle position, substantially perpendicular to the arm 40. This arm 66 is connected on the one hand to the mobile arm 40 and on the other arm, by a pivot link, to a stationary part 32 of the device (this stationary part also plays, in this example, the role of electrical connecting stud, but this is not mandatory). A displacement of the arm 40, under the effect of a displacement or deformation of the wall 25, causes a displacement of the arm 66 in the plane of the substrate 100 and the creation of a force (in compression or traction) where the mobile arm 66 is connected or hinged to the stationary part of the device. When this lever arm exerts a compression on one of the gauges, it exerts traction on the other gauge at the same time. A means $26_1$, $26'_1$ makes it possible to measure a resistance variation of each gauge, a positive variation of the resistance of one of the gauges being accompanied by a negative resistance variation of the other gauge. When the arm 40 returns to its initial position, the gauge(s) 64, 64' return(s) the arm 66 to its initial position (this is the initial position shown in FIG. 5B). The hinge, forming a pivot or a swivel, of the arm 66 makes it possible to guide the movement of the latter and perform the lever arm function.

As shown in FIG. 5A, the two arms 40 and 66 can, in direction z, have a thickness E substantially equal to that of the substrate 100. This makes it possible to ensure a certain rigidity of the arms 40 and 66 along the vertical axis z, and to maintain this assembly in the plane of the substrate 100.

Each gauge 64, 64' can have a thickness $e_0$ substantially smaller than E. There are then nanowire or NEMS gauges, for example described in US-2007/222011 or FR-09 57462. Alternatively, each gauge can be of the MEMS type, and have a thickness substantially equal to, or comparable to, that of the other elements 40, 66 of the mechanical structure and that of the substrate 100.

More precisely, each suspended strain gauge can have a thickness $e_0$ between, on the one hand, 10 nm or several tens of nm (for example 40 nm for a strain gauge of the nanowire type or 200 nm for a suspended strain gauge made from crystalline silicon or polycrystalline), and, on the other hand, several micrometers, for example 1 μm or 5 μm or 10 μm.

A gauge of the so-called "suspended" type is maintained between two parts called end parts. FIG. 5B shows that the gauge 64 (64', respectively) is maintained between an end connected or fastened to the stationary contact 30 (30', respectively), and a second end connected or fastened to the arm 66 so that a force exerted thereon also results in a force on each gauge. The two end zones can be fastened or connected to the arms 66 and the stationary studs 30, 30', for example through an embedded connection. The part of the gauge, called the central part, arranged between these two end parts has a non-zero length and is not in contact with any other material (although it may be coated with a passivation layer, silicon dioxide or silicon nitride, for example). In general, such a gauge is oblong in one direction (here: a direction parallel to the y axis), and with a much larger length (for example by a factor of 5 to 50), called gauge length, in this direction than along each dimension measured in a section perpendicular to said direction. It is maintained in two end parts (or embedding zones) that each have a short or very short length before the length of the gauge or its central part.

Each strain gauge therefore extends in a plane parallel to the plane of the sensor.

Each gauge is advantageously made from a piezoresistive material, for example monocrystalline or polycrystalline silicon, or it is made up of carbon nanotubes, or silicon nanowires, or metal . . . etc.

Everything described above on this type of gauge remains true in the embodiments of FIG. 6, 7A-7B, 9, or an alternative of FIG. 14 or 15, in which a detection by strain gauges is done.

When a position variation or deformation of the wall 25 occurs, the resistance of each gauge varies, and this resistance variation is detected by the means $26_1, 26'_1$.

In the example described relative to FIGS. 5A and 5B, both ends of the mobile wall 25 are embedded.

In one alternative, illustrated in FIGS. 5C and 5D, the wall 25 includes a rigid part, or main part, and a flexible part 252, forming a hinge of the rigid part and connecting the latter to a stationary wall $23_2 a$. This hinge can have any shape. The rigid part is free at its other end, near another stationary wall $23_1$. However, as shown in the figure, a communication 257 also remains between the cavity 20 and a potential secondary cavity 28. The detection means is identical to those described above: it includes the arm 40, the arm 66, the gauges 64, 64', and the studs 30, 30', 32. One end of the arm 40 is positioned this time on the side of the wall 25 closest to the stationary wall $23_2$. The other end of the wall 25 is free, i.e. when there is a pressure increase in the cavity 20, the wall 25 will undergo a rotational movement around the hinge 252. It will therefore bear on the arm 40, which in turn causes the arm 66 to move, the forces being expressed at the stationary end thereof translating to a signal of the gauges 64, 64'. The movement of the wall 25 is limited by the stop(s) 43: as shown in FIG. 5C, it is possible to position a stop on each side of the wall 25.

The device illustrated in FIG. 5D operates on the same principle, but this time a strain gauge 64 is arranged substantially perpendicular to the wall 25 when the latter is in the idle position, and directly in contact with a portion of the wall 25 close to the hinge 252. A force is therefore exerted directly on the gauge 64 when there is an overpressure or a vacuum in the cavity 20. The other end of the gauge is connected to a stationary stud 30. Another connecting stud 32 can be arranged on the stationary part 23.

The device illustrated in FIG. 5E operates on the same principle, but this time there are two strain gauges 64, 64' arranged substantially perpendicular to the wall 25 when the latter is in the idle position, and directly in contact with a portion of the wall 25 close to the hinge 252. These two gauges are arranged so as to provide a differential measurement. A force is therefore exerted directly on each of the gauges 64, 64' when there is an overpressure or partial vacuum in the cavity 20. The other end of each gauge is connected to the stationary stud 30, 30'. Another connecting stud 32 can be arranged on the stationary part 23.

Figure 6:
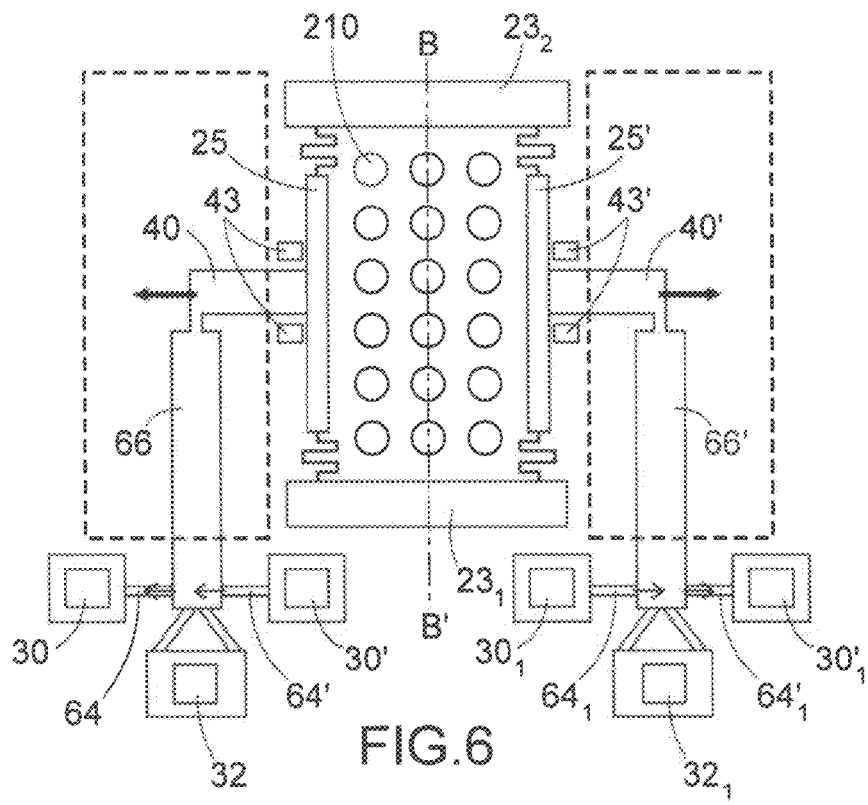

A fifth embodiment is illustrated in FIG. 6, in top view. This once again involves a differential system within the meaning already explained above.

It includes two mobile or deformable walls 25, 25', each being connected to its own lever arm system 66, 66' and piezoresistive gauges 64, 64' and $64_1, 64'_1$ as in FIGS. 5A and 5B. A set of connecting studs can be provided for each system of arms and gauges: in this way, stationary connecting studs $30_1, 30'_1, 32_1$ are provided for the gauges $64_1, 64'_1$ and stationary connecting studs 30, 30', 32 are provided for the gauges 64, 64'. The arm 66, 66' of each system is mechanically connected to one of these stationary studs so that a movement of each of these arms results in a force at the location of said connection.

When idle, the two arms 66, 66' are substantially parallel.

In this system, a pressure variation in the cavity 20 drives a displacement or deformation of the two walls 25, 25', but in opposite directions. This results in a movement of the arm 40 opposite that of the arm 40', and a movement of the arm 66 symmetrical to that of the arm 66' relative to the plane BB'. It also results in a resistance variation:

in each of the gauges 64, 64', which are connected to the lever arm 66, itself connected to the arm 40, and in each of the gauges $64_1, 64'_1$ which themselves are connected to the lever arm 66', itself connected to the arm 40'.

Here again, the two systems for measuring displacement or deformation of the walls 25, 25' are symmetrical to each other relative to a median plane, with outline BB' in FIG. 6, of the device, parallel to plane xz, which makes it possible to eliminate the parasitic signals that can come from an outside acceleration imposed on the device.

In this embodiment, the walls are of the "piston" type as explained above, for example relative to FIG. 5B, but it is also possible to use deformable walls or membranes of the type described above relative to FIGS. 2A and 2B.

Each of the examples of FIGS. 4, 5A-5B, 6 is shown with an upper opening in the form of a set of perforations 210, as in the second example. But a wide opening, like that of the first example, can be implemented in this third example. It is also possible, alternatively, to use a membrane such as the membrane 200 of FIG. 7A or 7B.

Each of these examples is also shown with contacts on the front face, but contacts on the rear face can be made as in the second example.

Figure 7A:
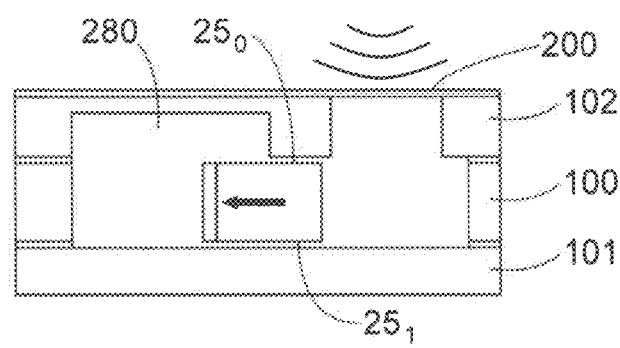
FIGS. 7A and 7B show, in side view, cross-section, and top view, an embodiment of another alternative of a device according.
Figure 7B:
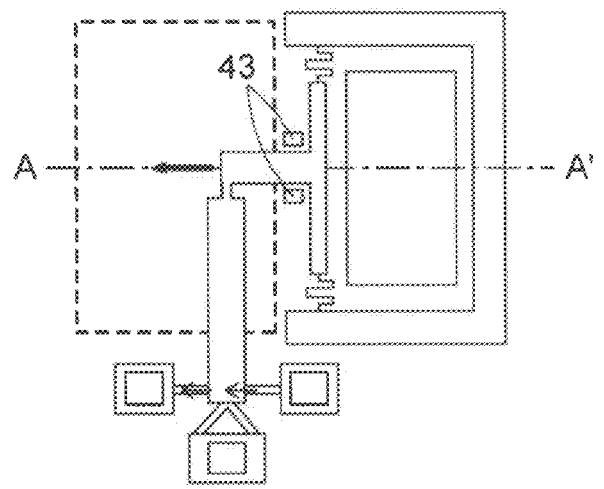

In each of the examples above, it is possible to have at least one secondary cavity, for example a lower cavity, as in FIGS. 2A-2B, but also lateral, as in the examples of FIGS. 2C and 16A-16B, or upper as in the example of FIGS. 7A-7B.

In a sixth example, illustrated in FIGS. 7A and 7B, a piezoresistive detection is again implemented, as in FIGS. 5A and 5B. FIG. 7A is a cross-sectional view along a plane, the outline AA' of which is shown in FIG. 7B (top view). It is possible to refer to the description above, relative to FIGS. 5A and 5B, regarding the detection means.

In this embodiment, a cavity 28 is not made in the lower substrate 101. However, a cavity 280 is made on the front face, in the upper substrate 102. This cavity has the same function as the lower cavity 28 of the preceding embodiments. It can be made with a volume adapted to that end. It is closed by a wall, so that the mobile wall 25 sees, on one side, the pressure variations to be measured (in the cavity 20) and, on another side, an average pressure that is affected little or not at all by the pressure variations to be measured.

Moreover, the first cavity 20 here is closed or partially closed by a flexible membrane 200. This membrane makes it possible to transmit the pressure variations to be measured and to prevent the entry of dust or moisture into the cavity 20. It can be adapted to the preceding embodiments, for example that of FIGS. 2A-2B.

As in the preceding embodiments, there is a communication between the different cavities (on one hand the main cavity and on the other hand the secondary cavity or cavities) due to the space between the upper (lower, respectively) part of the wall 25 and the lower (upper, respectively) surface of the upper (lower, respectively) substrate.

According to still another alternative example (in FIG. 8 in top view) a device can use a differential capacitive detection mode (as in FIGS. 2A and 2B), but also a plurality of cavities 20, 20', 20" arranged in parallel: the pressure in one of these cavities need only undergo a variation for the capacitive detection system to be driven and a movement or deformation of one of the mobile or deformable walls to be measured. But, above all, this device makes it possible to accumulate the effects and therefore make the component more sensitive. In this example, a device is described with three cavities, but a device with two cavities, or with more than three cavities, can also be made.

In the plane of the substrate 100, each cavity 20, 20', 20" is delimited by lateral walls 23, $23_1$, $23_2$, 25, 23', $23'_1$, $23'_2$, 25', 23"$_1$, 23"$_2$, 23", 25" some of which (walls 23, $23_1$, $23_2$, 23', $23'_1$, $23'_2$, 23", 23"$_1$, 23"$_2$) are stationary and at least one other (here the walls 25, 25', 25") is mobile in plane xy of the device. In the illustrated example, each cavity 20, 20', 20" is rectangular in the plane of the device, but another shape can be considered.

A pressure wave can penetrate each cavity 20, 20', 20" through the upper opening, which here is in the shape of a set of perforations 210 made in the substrate 102. But a single opening for each cavity can also be made.

A detection means 24, 24', $24_1$, $24'_1$ is stationary or, more generally, associated with the mobile walls, this means here assuming the form of capacitive combs, as already described above with FIGS. 2A and 2B. Alternatively, this means can include one or more strain gauge(s), for example one or more suspended piezoresistive gauges, as described below relative to FIG. 9. Here again, this detection method has already been described above, for example relative to FIG. 5A, 5B or 6.

Figure 8:
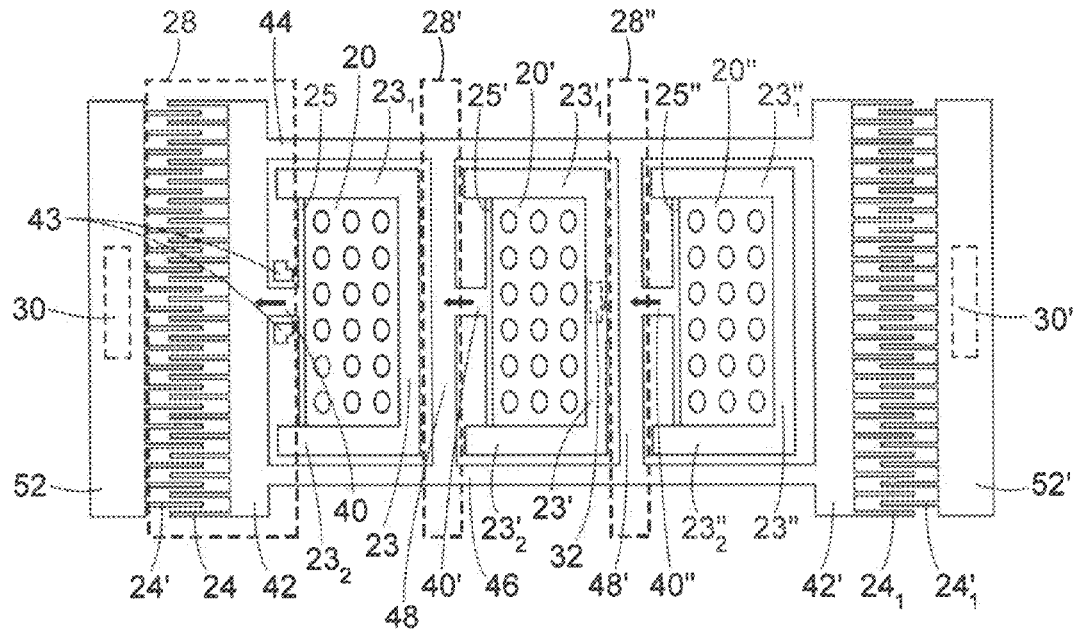
Figure 9:
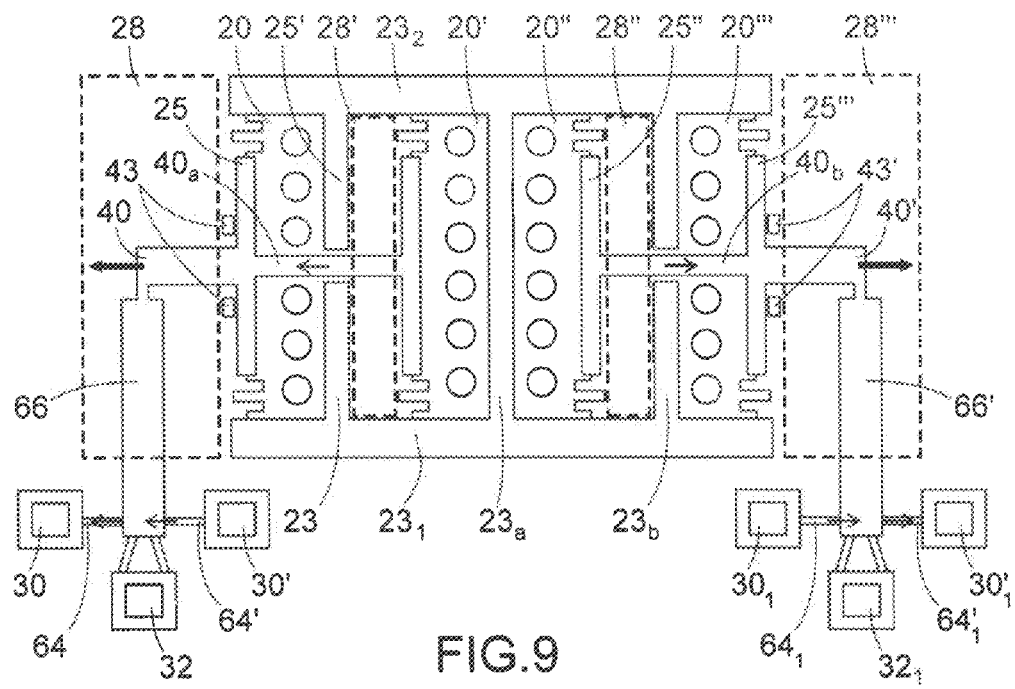

The embodiment of FIG. 8 shows that the arm 42 in fact makes up one of the sides of a frame including three other arms or sides 44, 46, 42' that surround the set of cavities 20, 20', 20". This entire frame is therefore made to move when one of the walls 25, 25', 25" moves due to a pressure variation in at least one of the cavities. The side or arm 42', opposite the arm 42, can also be connected to the mobile comb $24_1$, which is therefore also displaced, in the same direction as the arm 42', during a movement of one of the walls 25, 25', 25".

Two crosspieces 48, 48' are arranged parallel to the arms 42, 42' and delimit mobile frame portions, in each of which one of the cavities 20, 20', 20" is located. Connected to each of these crosspieces is the end of an arm 40', 40" whereof the other end is connected to one of the arms 25', 25".

The device includes at least one lower cavity 28, 28', 28" associated with each cavity 20, 20', 20". Each lower cavity is made in the lower substrate 101 and is open on the device. The alternatives described above, with a closed cavity above or below the device, or a cavity arranged laterally, can be applied to this embodiment.

The device also includes contact zones 30, 30', 32. These contact zones make it possible to connect the means for measuring a variation of the physical parameter, here a capacity variation, when one of the combs moves. In the illustrated example, these contacts are arranged on the front face of the device, i.e. they can be accessed through, or they can be made in, openings formed in the substrate 102. However, alternatively, it is also possible to make contacts on the rear face, as already seen above. One of the contacts is for example made in the stationary part 52, the other in the stationary part 52'. Another contact 32 can be formed in a portion of one of the stationary frames, for example the wall 23'.

Here again, guide arms such as the arms 56, 58, 56', 58' of FIGS. 2 and 3 can be made, but having several mobile walls also makes it possible not to implement such guide means.

The structure of this FIG. 8 is not a differential structure: an impact, or, more generally, any outside acceleration will be detected as a pressure variation.

According to another alternative (in FIG. 9 in top view), a device as disclosed in this application uses a detection mode by strain gauges (as in FIGS. 5A-7B), but with a plurality of cavities 20, 20', 20", 20'" arranged in parallel. In particular, a pressure variation need only occur in the cavity 20 (20", respectively) for a differential detection to occur with a cavity 20' (20'", respectively), which makes it possible to do away with any outside accelerations.

In the plane of the substrate 100, each cavity 20, 20', 20", 20'" is delimited by lateral walls 23, 25, $23_k$, $23_2$, 23a, 23b, 25', 25", 25'" some of which (walls 23, 25, $23_1$, $23_2$, 23a, 23b) are stationary and other (here walls 25, 25', 25", 25'") are mobile or deformable in plane xy of the device. In the illustrated example, each cavity 20, 20', 20" is rectangular in the plane of the device, but another shape can be considered.

The atmosphere, the pressure of which is to be measured, can penetrate each cavity 20, 20', 20", 20'" through the upper opening, which here is in the form of a set of perforations 210 made in the substrate 102. But a single opening for each cavity can also be made or a membrane can close each cavity, as in FIG. 7A.

Detection means 66, 66', 64, 64', $64_1$, $64'_1$ are fastened or, more generally, associated with the mobile walls, these means here assuming the form of strain gauges, for example one or several suspended piezoresistive gauges, as already described above relative to FIGS. 5A, 5B and 6.

The formation of the cavity 20 and its means 40, 66 for transmitting the deformation or displacement of the gauges is very close to what was already described above, for example relative to FIG. 5B.

One difference lies in the presence of an arm 40a that connects the mobile or deformable wall 25' to the detection means 40, 66, 64, 64'. This arm passes through the stationary wall 23 and is fastened to the wall 25, thereby transmitting any deformation or any displacement of the wall 25' to the wall 25, and therefore the detection means 40, 66, 64, 64'.

Likewise, an arm 40b connects the mobile or deformable wall 25" to the detection means 40', 66', $64_1$, $64'_1$. This arm passes through the stationary wall 23b and is fastened to the wall 25", thereby transmitting any deformation or displacement of the wall 25" to the wall 25'", and therefore the detection means 40', 66', $64_1$, $64'_1$.

The detection means chosen here do not need to implement a mobile frame around the cavities, unlike the embodiment of FIG. 8. The function of this frame is performed here by the connecting arms 40a, 40b, which makes it possible to parallel the forces exerted on the walls 25, 25' and 25", 25'".

A central wall 23a is not passed through by any arm and separates the chambers 20, 20' connected to the detection means 40, 66, 64, 64' and the chambers 20", 20''' connected to the detection means 40', 66', 64$_1$, 64'$_1$.

The device has at least one lower cavity 28, 28', 28", 28''' associated with each cavity 20, 20', 20", 20'''. Each cavity is made in the lower substrate 101 and is open under the device. The variations described above, with a closed cavity above or below the device, or at least one lateral cavity, can be applied to this embodiment.

The device also includes contact zones 30, 30', 32, 30$_1$, 30'$_1$, 32$_1$. In the illustrated example, these contacts are arranged on the front face of the device, i.e. they can be accessed through, or made in, openings formed in the substrate 102. But, alternatively, it is also possible to make contacts on the rear face, as already seen above.

Such a system is differential in that it makes it possible to differentiate between a pressure signal to be measured and an outside acceleration. In other words, the latter will not be seen as a disruption likened to a pressure variation. It also operates in differential measurement, i.e. any movement of a mobile wall in a direction occurs at the same time as a movement of the other mobile wall in the other direction, and a variation of the signal coming from the detection means associated with one of the walls in the is opposite a variation of the signal coming from the detection means associated with the other wall.

In all of the described embodiments, it is possible to produce mechanical stops 43, 43' to limit the displacement of the deformable or mobile membrane under the effect of an overpressure. In all of the embodiments, it is even possible to put stops on each side of the membrane 25, such as for example in FIG. 5C, or use a means forming a lug or a pin on the arms 40, like the means 400, 401 of FIG. 5B. Stops can also be formed in the substrate 100.

Preferably, a microphone measures acoustic pressures of several tens of Hz to 20 kHz. It is advantageously possible, in the embodiments described above, to associate several microphones having different bandwidths.

For example, it is possible to associate three microphones, a first responding mainly in the 10 Hz-500 Hz range, a second microphone in the 500 Hz-5000 Hz range, and a third in the 5 kHz-20 kHz range. In such a system, each microphone can be distinct from each other microphone, each membrane 25 having a different bandwidth from that of the other membranes. The bandwidth of a membrane is defined by the resonance frequency of that membrane; this resonance frequency is preferably greater than the maximum frequency of the pressure wave to be measured. This can be completed by electronic filtering means of the measured signal.

FIG. 13A shows another device, with capacitive detection, in which the membrane 25 is connected to an electrode, which faces a stationary electrode 240. Between the latter and the stationary walls of the cavity, a potential difference can be established that will make it possible to detect a variation of the capacitance done by the two electrodes 25, 240 that face each other. A potential difference can be applied between the studs 30, 32.

Figure 13B:
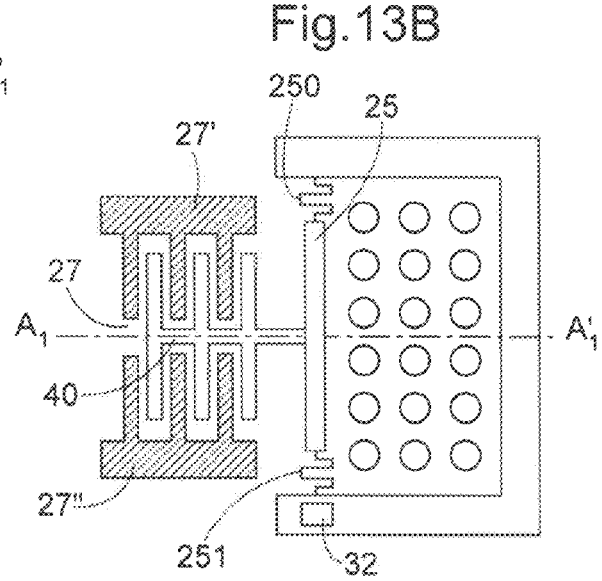

FIG. 13B shows still another embodiment, wherein the detection, also of the capacitive type, is made by a system of combs, the teeth of which are, this time, oriented along the x axis, not along the y axis as in FIGS. 2A-2B. An arm 40, substantially perpendicular to the wall 25, supports the teeth of the mobile part of the comb 27, two stationary parts 27', 27" of the comb being arranged, relative to each row of teeth, as already explained above in relation to FIG. 2B.

FIG. 14 illustrates another aspect of an alternative of a device as disclosed in this application, wherein the cavity 20 is delimited by several mobile walls 25, 25a, 25b, the walls 25a, 25b here being arranged substantially parallel to each other and substantially perpendicular to the wall 25 when the device is idle. These mobile walls are completed by a portion or a stationary wall 23 of the device to which they are connected. These mobile walls and this stationary wall delimit the cavity 20. The detection means, here of the capacitive type, and more particularly in the form of a system of combs, described above in connection to FIG. 2B, will make it possible to detect any displacement or deformation of the mobile wall 25. The other two deformable walls 25a, 25b will have movements in a lateral direction, perpendicular to the direction of deformation of the wall 25, that it will not be necessary to detect.

FIG. 15A illustrates still another alternative of a device as disclosed in this application, in which the cavity 20 is delimited by two deformable walls 25, 25', the ends of these deformable walls being connected to stationary studs 23$_1$, 23$_2$ of the device. In other words, the cavity 20 is essentially delimited by the deformable walls, stationary portions of the walls being reduced to a very small surface area. The walls 25, 25' delimit a volume of a cavity 20, which will, during a pressure variation, undergo movements similar to those of a balloon that inflates or deflates. The detection means, here of the capacitive type, and more particularly in the form of a system of combs such as the systems of combs described above relative to FIG. 2B, will make it possible to detect any displacement or deformation of the mobile walls 25, 25'. The system is therefore a differential measurement system. It would therefore be possible to make a main cavity 20, delimited by more than two deformable walls, with additional stationary studs.

The structure of FIG. 15B is an alternative to that of FIG. 15A, in which the inside of the main cavity 20 is delimited only by deformable walls 25, 25' that are also connected, by their outside surface, to at least one (here: two) stationary studs 23$_1$, 23$_2$ of the device. One or more parts of the deformable wall(s) 25, 25' can be connected to detection means, for example of the capacitive or strain gauge type, which is symbolized in FIG. 15B by dotted lines (these detection means were already explained in relation to the preceding figures).

A device a device as disclosed in this application includes a stationary part, i.e. the position of which does not evolve under the action of a pressure variation in the cavity 20, and a mobile part, the position of which evolves or is modified under the action of a pressure variation in the cavity 20. The mobile part is connected to the stationary part of the means making it possible to return it to its initial position relative thereto when the pressure in the cavity 20 has returned to its initial value or has elasticity properties allowing it to return to its initial position.

A device or system a device as disclosed in this application can have a differential structure, which allows it to detect only the pressure variations occurring in the main cavity 20. The impacts or outside accelerations are neutralized, and are not detected. Examples of such differential structures have already been provided above.

A device or system a device as disclosed in this application can allow, in certain configurations, a differential measurement, i.e. the detection means associated with mobile or deformable walls will have signal variations of the same amplitude, or substantially the same amplitude, but different signs.

Certain configurations can have a differential structure, but not allow differential measurement.

Certain other configurations have a differential structure, but also allow a differential measurement, including for the case of a capacitive detection.

In the different embodiments described, the mobile or deformable wall can be of the "embedded-embedded" type (both of its ends are fastened in a stationary part of the device) or "embedded-free" (one of its ends being fastened in a stationary part of the device, and the other end being free), or include a rigid part that moves in a "piston" manner while being accompanied in this movement by deformable lateral portions, for example of the "spring" type.

FIGS. 10A-10G illustrate a first example of a method for producing a device as disclosed in this application. In this example, the contacts are on the front face and the cavity 28 is in the rear face.

This method involves attaching a second substrate.

One starts (FIG. 10A) from a SOI substrate (with a buried oxide (BOX) 103, for example 0.5 µm thick). Alternatively, one starts from a standard substrate 101, on which a deposition 103 of a sacrificial layer (oxide) and a deposition 100 of a semi-conductor material, e.g. silicon or polycrystalline SiGe, is done.

Then, a metal deposition 105 (ex: Ti/Au or AlSi, ...) is done, as well as a lithography and etching of the contacts 30, 30'. It is possible to make the contacts on the rear face using the same technique.

Then, one performs (FIG. 10B) a lithography and etching of the superficial silicon layer to define the acoustic cavity 20 and the mechanical structure, in particular including at least one mobile or deformable wall 25, possibly a mobile frame, possibly one or more stops, and the detection elements (capacitive combs or strain gauges) the details of which are not shown here: the etching masks used are adapted to produce the suitable means as a function of the type of detection done.

Figure 10A:
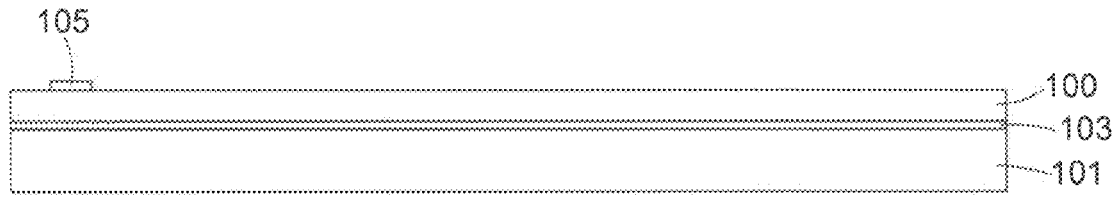
FIGS. 10A-10G show an example of an method for making of a device.
Figure 10B:
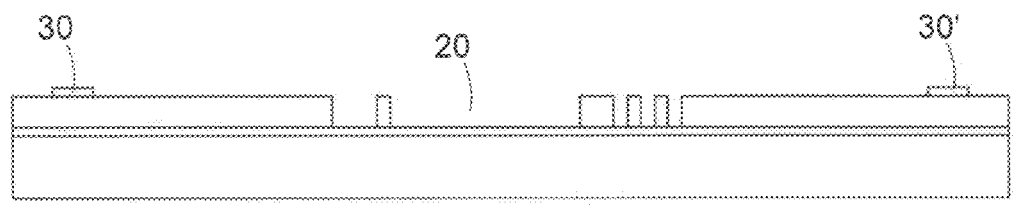
Figure 10C:
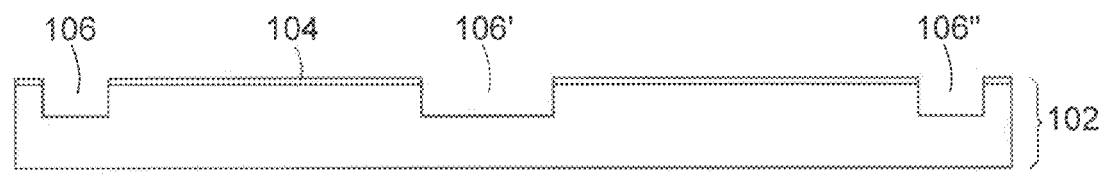
Figure 10D:
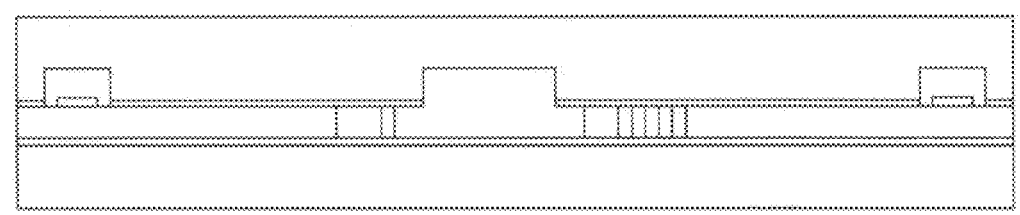
Figure 10E:
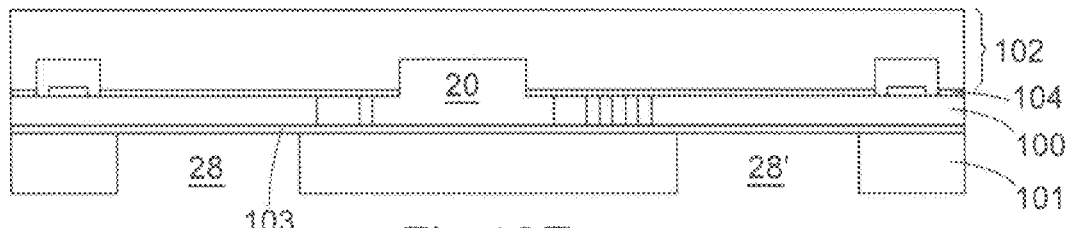

Furthermore, on a base of a traditional Si substrate 102, a deposition 104 of silicon oxide (SiO2), for example is done with a thickness of about 0.8 µm (FIG. 10C).

Lithography and etching (partial or complete) of the oxide 104 and the silicon 102 will then be done in order to form openings 106, 106', 106" for the entry of the pressure and the opening of the contacts.

The two substrates are then aligned (FIG. 10D) and sealed (by direct sealing, or eutectic, or polymer, or anodic, ...), such that the openings 106, 106', 106" communicate with the contacts 30, 30' and the cavity 20.

Lithography and etching (FIG. 10E) of openings of the cavities 28, 28' are then done on the rear face ("back volume").

Figure 10F:
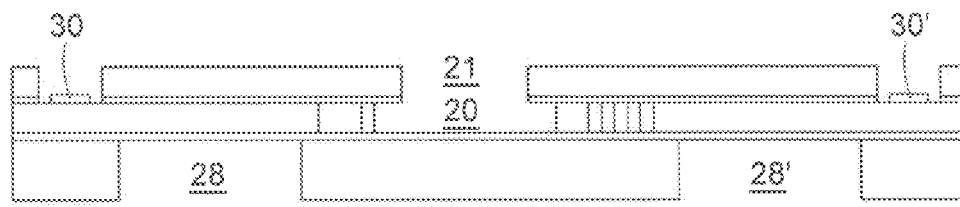
Figure 10G:
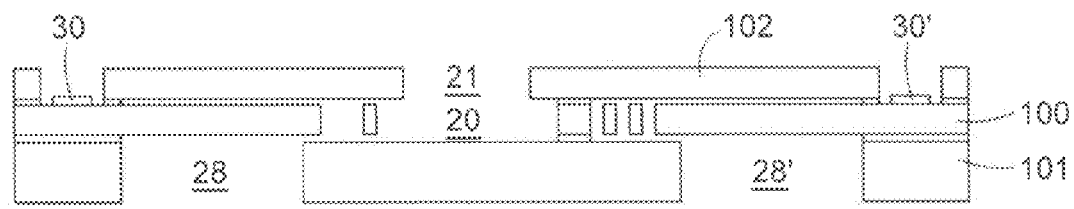

By thinning the front face ("back-grinding"), an opening of the cavities 21 and contacts 30, 30' is formed (FIG. 10F).

Lastly, the mobile structure (FIG. 10G) is freed by removing the parts of the sacrificial oxide layers 103, 104 by HF etching (e.g. steam).

FIGS. 11A-11F illustrate a second embodiment, with an insulating substrate being attached (or with lamination of a polymer film).

One starts (11A) from a 501 substrate, with a buried oxide (BOX) 103, for example 0.5 µm thick. Alternatively, one starts from a standard substrate 101, on which a deposition 103 of a sacrificial layer (oxide) is done, and a deposition 100 of a semiconductor material, for example in silicon or polycrystalline SiGe.

Then lithography and etching is done on the superficial silicon layer 100 (for example on a thickness of about 0.8 µm) to define thickness blocks or shims 107, on the front face.

Figure 11A:
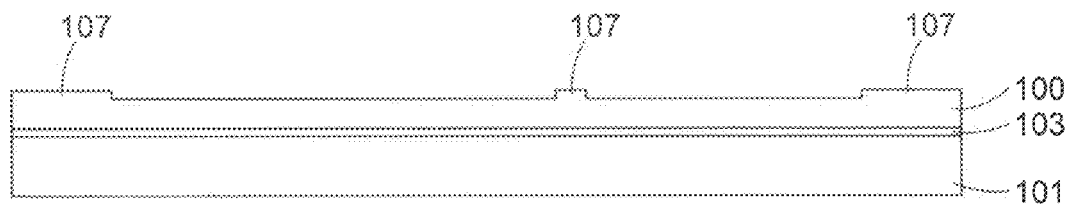
FIGS. 11A-11F show an example of another method for making of a device.
Figure 11B:
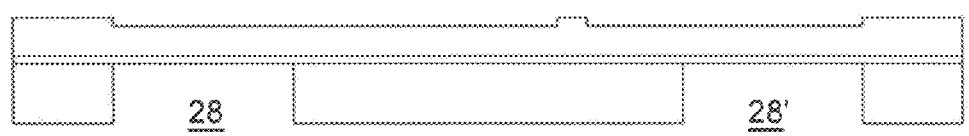

Lithography and etching of the openings of the cavities 28, 28' on the rear face ("back volume") is done (FIG. 11B).

Figure 11C:
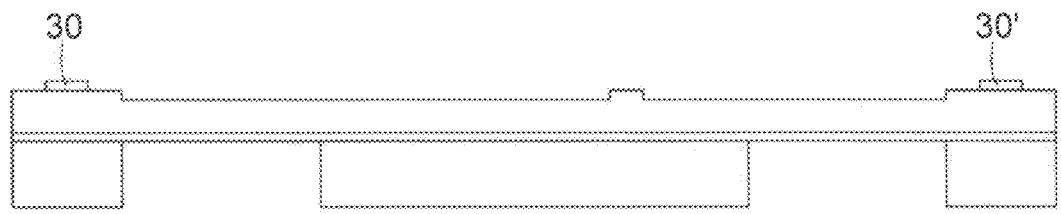
Figure 11D:
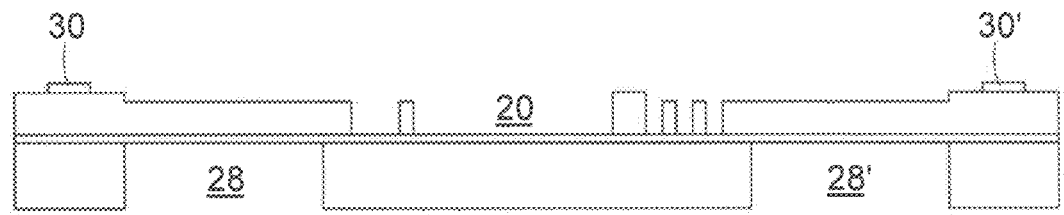
Figure 11E:
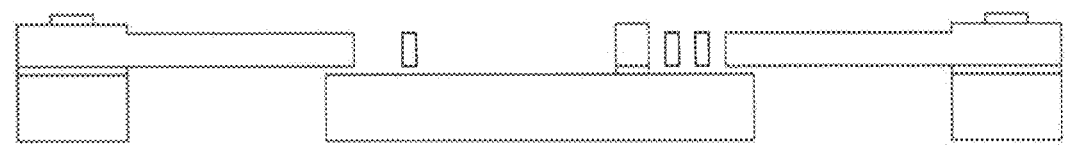
Figure 11F:
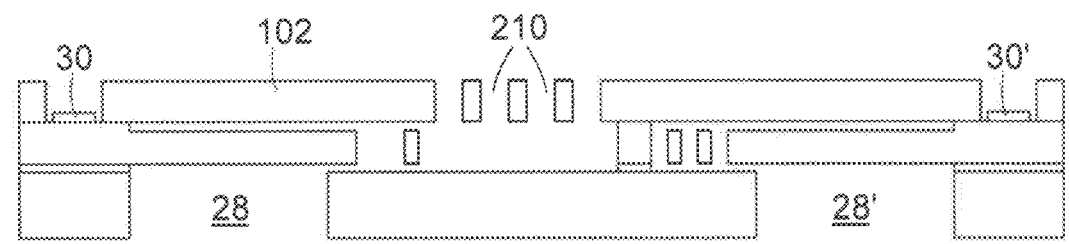

Then a metal deposition (ex: Ti/Au or AlSi, ...) is done, as well as lithography and etching of the contacts 30, 30' (FIG. 11C). It is possible to produce the contacts on the rear face using the same technique.

Lithography and etching of the superficial silicon layer is then done (FIG. 11D) to define the acoustic cavity 20 and the mechanical structure, including in particular the mobile or deformable wall 25, any mobile frame and the detection elements (capacitive combs or strain gauges), the details of which are not shown here: the etching masks used are adapted to make the adequate means as a function of the type of detection done.

One then frees (FIG. 11E) the mobile structure by removing parts of the sacrificial oxide layer 103 by HF etching (steam, for example).

Lastly, one proceeds (11F) with an adhesion or sealing (for example anodic sealing) of the structure just obtained with a substrate 102, for example in glass, pre-etched, which can be thinned after sealing or laminating of a dry film (polymer, polyamide, ...) and lithography and etching of the openings 210 to put the cavity 20 in communication with the ambient atmosphere and to produce access to the contacts 30, 30'. Alternatively, a single opening 21 as in FIG. 2A can also be made.

Figure 12A:
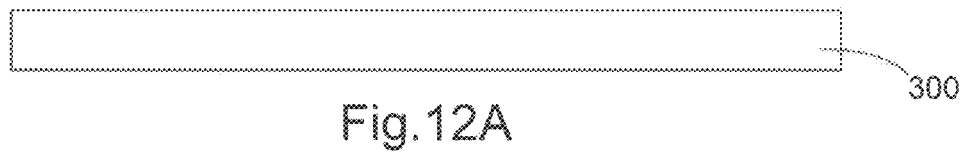
FIGS. 12A-12C show steps of an alternative of another method for making a device.

Following the same progression, the method starts with a standard substrate 300 (FIG. 12A), for example made from a semiconductor material such as silicon.

Figure 12B:
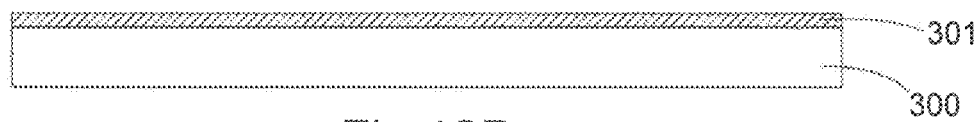

On that substrate, a deposition of a sacrificial layer 301 is done (FIG. 12B), for example an oxide layer, which, here again in an example, can have a thickness equal to about 0.5 µm.

Figure 12C:
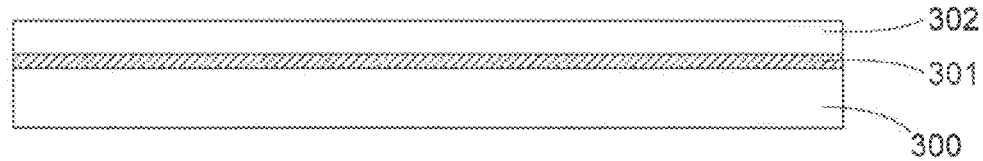

One then deposits, on the sacrificial layer 301, an active layer 302 of poly-Si or poly-SiGe (FIG. 12C) whereof the thickness can be, for example, about 10 µm. One then returns to the previous method from one of FIG. 10A or 11A.

In general, the sacrificial layers 103, 104 are for example between several hundred nm and several microns, for example between 100 nm or 500 nm and 1 µm or 2 µm. The active layers 100, 101, 102 (each is for example made from Si, or SiGe, ...) are between several µm and several tens of µm, or even several hundred µm, for example between 5 µm and 10 µm or 50 µM or 200 µm.

The device disclosed in this application offers a possibility for better technological monitoring than the structures made in the prior art, because the mechanical part of the device does not use a deposited thin layer: the mechanical properties of the mobile part (the membrane(s) 25) are first determined by the shape of that element, and not by its thickness, as was previously the case in the state of the art.

A structure as disclosed in this application also offers the following advantages:
  there are no holes in the mechanical part sensitive to the pressure to be measured (resulting in a limitation of acoustic loss),
  possibility of having a piston effect: the pressure then causes a displacement of the entire structure (which is not the case for an embedded membrane).

The teaching of the present application applies to the production of microphone or dynamic pressure sensor components, in particular for general public applications (mobile telephones, games, MP3 players, television sets, ...).

In one particular application, a device according to any one of the embodiments described above can be used in combination with a means for recovering acoustic energy. For example, the electrical circuit that includes the studs 30, 30' is provided with a means for storing electrical energy, for example one or more batteries: the mechanical energy resulting from the deformation of the deformable cavity, and which translates the pressure variations of the ambient atmosphere, is converted into electrical energy (which is already clear according to the explanations above, since this energy makes it possible to detect the movements or displacements of the detection means), but this electrical energy can also be stored.

The invention claimed is:

1. A pressure sensor of the MEMS and/or NEMS type, comprising:
    at least one first deformable cavity configured to receive pressure variations from an ambient atmosphere, this first deformable cavity being made in at least a first planar layer extending in a sensor plane of the pressure sensor, and including at least one movable wall which is movable only along said sensor plane, wherein pressure variations are transmitted from an ambient atmosphere to said cavity;
    at least one detector having a stationary part provided in at least said sensor plane and being stationary relative to said movable wall, the at least one detector being configured to detect a displacement of the movable wall in the sensor plane under the effect of a pressure variation of the ambient atmosphere; and
    at least one secondary cavity, partially in communication with the first deformable cavity, said secondary cavity forming a reference cavity, wherein the secondary cavity is separated from the first cavity at least partially by the at least one movable wall, and the displacement of the movable wall takes place under the effect of a pressure difference between pressures in the first deformable cavity and the secondary cavity.

2. The sensor according to claim 1, further comprising a second layer extending in a plane parallel to said sensor plane, said second layer being different from the first layer, wherein the at least one secondary cavity being made in at least one of the sensor plane and the plane of the second layer.

3. The sensor according to claim 2, wherein said secondary cavity being made in the plane of the second layer extending in a plane parallel to said sensor plane, and wherein
    said pressure variations of the ambient atmosphere being transmitted to said first cavity through said second layer,
    or said second layer being arranged on a side, parallel to said sensor plane, a third layer being arranged on another side, extending in a plane parallel to said sensor plane, said pressure variations of the ambient atmosphere being transmitted to said first cavity through said third layer.

4. The sensor according to claim 1, wherein said detector being of the capacitive type or of the strain gauge type.

5. The sensor according to claim 4, said detector being of the capacitive type and comprising:
    at least one first comb which is able to move in the sensor plane; and
    at least one second comb coupled to the stationary part and, stationary relative to the first comb, the teeth of the first comb and those of the second comb alternating, wherein movement of said movable wall in the plane of the sensor is transmitted to said first comb.

6. The sensor according to claim 4, wherein the detector being of the capacitive type, based on an air gap variation.

7. The sensor according to claim 4, wherein said detector including a strain gauge.

8. The sensor according to claim 7, further comprising:
    a lever arm able to move in the sensor plane of the sensor, wherein movement of the movable wall, in the plane of the sensor being transmitted to said lever arm; and
    at least one strain gauge configured to detect a displacement of the lever arm in the plane of the sensor.

9. The sensor according to claim 1, wherein said at least movable wall including two lateral ends, wherein:
    one lateral end being embedded or fastened on a stationary wall, and the other lateral end being free, or,
    both lateral ends being embedded or fastened to a stationary wall, or
    the movable wall being rigid, and maintained at both of its lateral ends by deformable elements.

10. The sensor according to claim 1, comprising a first detector and a second detector mounted so as to perform a differential measurement.

11. The sensor according to claim 1, wherein the sensor having a differential structure.

12. The sensor according to claim 1, wherein pressure variations from an ambient atmosphere being transmitted, in the first cavity, through at least one opening arranged opposite an opening of said first deformable cavity or a membrane arranged on an opening of said first deformable cavity.

13. The sensor according to claim 1, wherein said at least one detector being mechanically connected to said movable wall.

14. A device for detecting pressure variations, including a plurality of sensors according to claim 1, each sensor having a bandwidth different from a bandwidth of each other sensor in the plurality of sensors.

15. A device for recovering acoustic energy, including a sensor according to claim 1, and further comprising a device storing electrical energy resulting from said pressure variations.

16. A pressure sensor of the MEMS and/or NEMS type, including:
    at least one first deformable cavity configured to receive pressure variations from an ambient atmosphere, this first deformable cavity being made in at least a first planar layer extending in a sensor plane of the pressure sensor, and including at least one movable wall which is movable only along said sensor plane, wherein pressure variations are transmitted through at least one hole from an ambient atmosphere to said cavity; and
    at least one detector having a stationary part provided in at least said sensor plane and being mechanically connected to said movable wall to detect a displacement of the movable wall in the sensor plane under the effect of a pressure variation of the ambient atmosphere.

17. The sensor according to claim 16, further having at least one secondary cavity partially in communication with the first cavity, said secondary cavity forming a reference cavity.

18. A method for producing a MEMS and/or NEMS pressure sensor comprising:
    producing, in a first planar layer, extending in a sensor plane at least one first deformable cavity for receiving pressure variations from an ambient atmosphere, this deformable cavity being delimited by at least one movable wall which is movable only along said sensor plane;
    producing at least one detector configured to detect a displacement, in said sensor plane, of said movable wall, under the effect of a pressure variation, the detector including a stationary part which is stationary relative to the movable wall;
    producing at least one secondary cavity, partially in communication with the first cavity, said secondary cavity forming a reference cavity, wherein the secondary cavity is separated from the first cavity at least partially by the at least one movable wall, and the displacement of the movable wall takes place under the effect of a pressure difference between pressures in the first deformable cavity and the secondary cavity; and producing a means for transmitting pressure pulses from an ambient atmosphere to said cavity.

19. The method according to claim 18, at least one secondary cavity partially communicating with the first cavity, said secondary cavity forming a reference cavity.

20. The method according to claim 19, at least one secondary cavity being made in the plane of a second layer, extending in a plane parallel to said sensor plane, said second layer being different from the first layer, or being made in the plane of the first layer.

21. The method according to claim 20, the first layer and the second layer being assembled via a dielectric layer to form a SOI substrate.

22. The method according to claim 21, further comprising assembling the first layer with a third layer, extending in a plane parallel to said sensor plane, to form a means for transmitting said pressure variations to the first cavity.

23. The method according to claim 18, said at least one detector being made at least partially in the first layer.

24. The sensor according to claim 1, wherein said movable wall comprises a mobile or deformable wall.

25. The sensor according to claim 1, wherein said first planar layer comprises a planar layer or a substrate.

26. The sensor according to claim 1, wherein said secondary cavity is a buffer cavity.

\* \* \* \* \*